(12) United States Patent
Takagi

(10) Patent No.: US 8,431,973 B2
(45) Date of Patent: *Apr. 30, 2013

(54) HIGH FREQUENCY SEMICONDUCTOR DEVICE

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 707 days.

This patent is subject to a terminal disclaimer.

(21) Appl. No.: 12/551,981

(22) Filed: Sep. 1, 2009

(65) Prior Publication Data

US 2010/0140721 A1    Jun. 10, 2010

(30) Foreign Application Priority Data

Dec. 10, 2008  (JP) ................................ P2008-314841

(51) Int. Cl.
 *H01L 29/80* (2006.01)
(52) U.S. Cl.
 USPC ........... 257/287; 257/192; 257/341; 257/343; 257/401
(58) Field of Classification Search .................. 257/401, 257/341, 192, 343, 287
 See application file for complete search history.

(56) References Cited

U.S. PATENT DOCUMENTS

| | | |
|---|---|---|
| 3,893,159 A | 7/1975 | Martin |
| 5,973,567 A | 10/1999 | Heal et al. |
| 6,023,080 A | 2/2000 | Kojima |
| 7,411,288 B2 | 8/2008 | Takagi |
| 2003/0030481 A1 | 2/2003 | Oumaru |
| 2004/0000676 A1 | 1/2004 | Fujioka et al. |
| 2005/0090223 A1 | 4/2005 | Behzad |
| 2006/0138650 A1 | 6/2006 | Hidalgo et al. |
| 2007/0096340 A1 | 5/2007 | Piel et al. |
| 2007/0229187 A1 | 10/2007 | Takagi |

FOREIGN PATENT DOCUMENTS

| | | |
|---|---|---|
| DE | 103 24 069 A1 | 12/2004 |
| JP | 4-109701 | 4/1992 |
| JP | 11-238851 | 8/1999 |
| WO | WO 01/61752 A1 | 8/2001 |

OTHER PUBLICATIONS

U.S. Appl. No. 12/913,170, filed Oct. 27, 2010, Takagi.
U.S. Appl. No. 12/780,280, filed May 14, 2010, Ng, et al.
U.S. Appl. No. 12/786,942, May 25, 2010, Takagi.

*Primary Examiner* — Samuel Gebremariam
(74) *Attorney, Agent, or Firm* — Oblon, Spivak, McClelland, Maier & Neustadt, L.L.P.

(57) ABSTRACT

A high frequency semiconductor device includes: a field effect transistor including gate terminal electrodes, source terminal electrodes, and a drain terminal electrode; an input circuit pattern and an output circuit pattern which are disposed adjoining of the field effect transistor; a plurality of input bonding wires configured to connect the plurality of the gate terminal electrodes and the input circuit pattern; and a plurality of output bonding wires configured to connect the drain terminal electrode and the output circuit pattern, which makes matching an input/output signal phase by adjusting an inductance distribution of a plurality of input/output bonding wires, and improves gain and output power, and suppresses an oscillation by unbalanced operation of each FET cell.

28 Claims, 17 Drawing Sheets

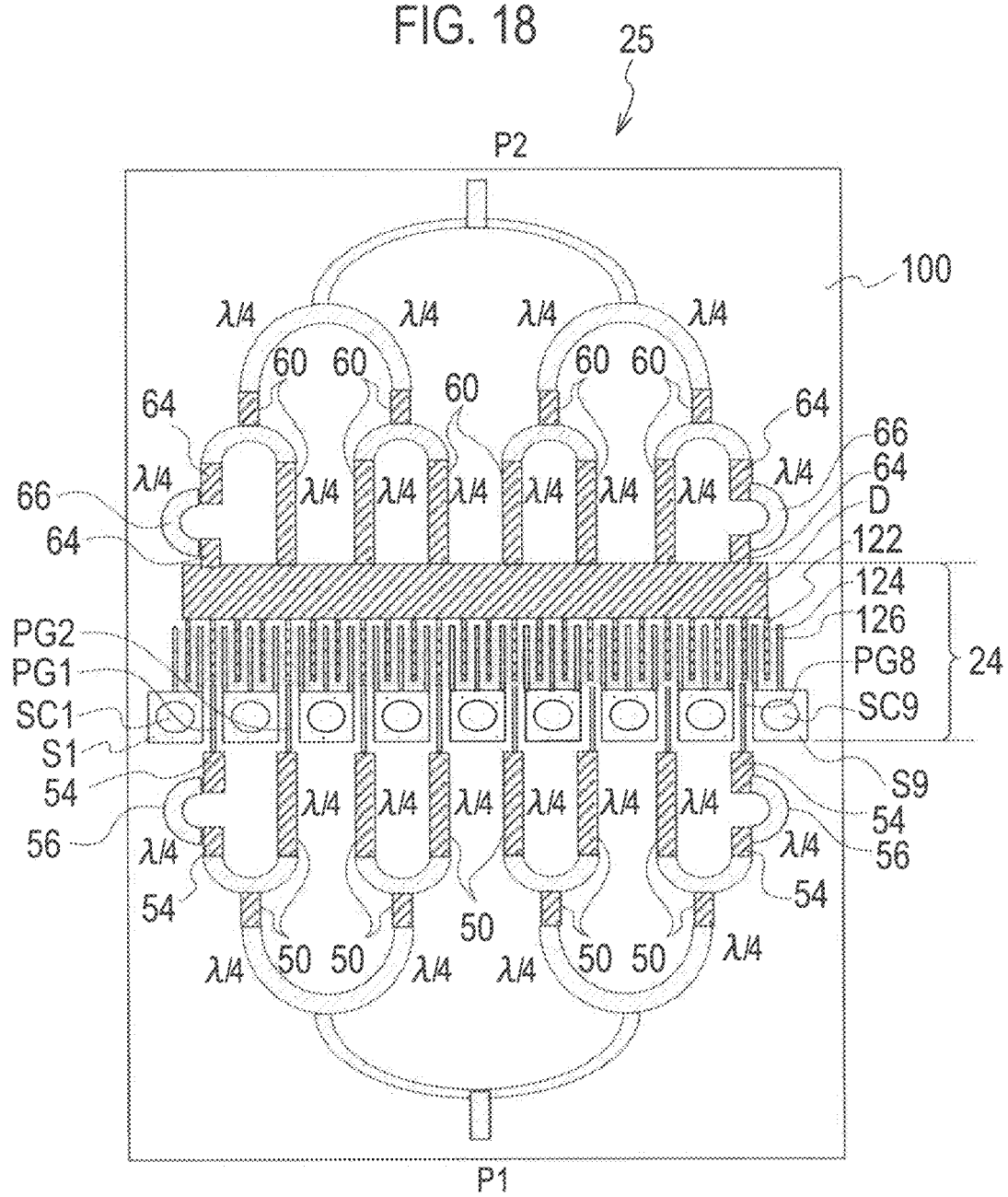

HIGH FREQUENCY SEMICONDUCTOR DEVICE

CROSS REFERENCE TO RELATED APPLICATIONS AND INCORPORATION BY REFERENCE

This application is based upon and claims the benefit of priority from prior Japanese Patent Applications No. P2008-314841 filed on Dec. 10, 2008, the entire contents of which are incorporated herein by reference.

TECHNICAL FIELD

The present invention relates to a high frequency semiconductor device, and in particular, relates to a high frequency semiconductor device for adjusting a plurality of input/output bonding wires or the inductance distribution of an input/output transmission line.

BACKGROUND ART

In order to obtain current capacity as a connecting means between an FET (Field Effect Transistor) and a microwave transmission line, the ingenuity which approaches to place a plurality of same-shaped bonding wires in parallel is given. Moreover, also in order to make inductance small as a connecting means between the FET and the microwave transmission line, the ingenuity which approaches to place a plurality of same-shaped wires in parallel is given.

The semiconductor device used with a high frequency band, for example, a microwave power amplifier, is composed of active elements, such as FETs, passive elements, such as resistance, a capacitor, and circuit elements, such as a microstrip transmission line for transmitting a high frequency signal. In such a microwave power amplifier, as shown in FIG. 1, for example, the FET is formed on a semi-insulating substrate 100, and includes a gate terminal electrode G, a source terminal electrode S, and a drain terminal electrode D which are disposed on a first surface of the semi-insulating substrate 100. The gate terminal electrode G is connected to an input circuit pattern on a dielectric substrate 26 disposed at an edge part by an input bonding wire 12. Similarly, the drain terminal electrode D is connected to an output circuit pattern on a dielectric substrate 28 disposed at an edge part by an output bonding wire 14, for example.

In the example of FIG. 1, in the source terminal electrode S, a VIA hole SC is formed from the backside of the semi-insulating substrate 100, and a ground conductor 125 is formed on the backside of the semi-insulating substrate 100. And when grounding a circuit element, the circuit element provided on the semi-insulating substrate 100 and the ground conductor 125 formed on the backside of the semi-insulating substrate 100 are electrically connected via the VIA hole SC which passes through the semi-insulating substrate 100.

About a microwave amplifier which modulates the inductance of the bonding wire of the edge part by adjusting the length of the bonding wire of the edge part, it is already disclosed (for example, refer to Patent Literature 1).

CITATION LIST

Patent Literature 1: Japanese Patent Application Laying-Open Publication No. H11-238851

However, in the microwave amplifier of Patent Literature 1, since the length of the bonding wire is adjusted by changing the position of the connected point of the bonding wire, the connected point of the bonding wire will not uniform on the input terminal and the output terminal, and the electric field distribution will be confused in this part.

SUMMARY OF THE INVENTION

Technical Problem

On the other hand, in an FET of multi-finger structure, a gate finger electrode and a drain finger electrode are preferable to perform wire connection to an equivalent potential. That is, it is preferable that the phase of input signals, such as microwave applied to each gate finger electrode, has uniformed, and that the phase of output signals, such as microwave outputted from the drain finger electrode, has uniformed. It is because the distribution and coupling efficiency between the input signals and the output signals, such as the microwave, becomes high, by uniforming the phase of the input signal applied to each gate finger electrode, and uniforming the phase of output signals, such as the microwave outputted from the drain finger electrode.

However, as for a plurality of bonding wires used as a connecting means between the FET and the microwave transmission line, each inductance becomes large because of the mutual inductance occurred between the approaching bonding wires, i.e., coupling.

In a plurality of bonding wires disposed in parallel between the FET and the microwave transmission line, the bonding wire of an edge part where the influence of coupling is small differs in the value of the inductance from the bonding wire of the central part where the influence of coupling is large.

That is, in a plurality of bonding wires disposed in parallel between the FET and the microwave transmission line, the value of the inductance of the bonding wire of the central part becomes larger than the value of the inductance of the bonding wire of the edge part. The difference of such the value of inductance causes the phase shift of the input signal between each gate finger electrode. Similarly, the phase shift of the output signal between each drain finger electrode occurs.

When the phase difference occurs, the degrade of the gain of the FET and the degrade of the output power occur, and the oscillation by unbalanced operation of each FET cell occurs.

Solution to Problem

According to an aspect of the invention, a high frequency semiconductor device comprises: a field effect transistor including a semi-insulating substrate, a gate finger electrode, a source finger electrode, and a drain finger electrode which are disposed on a first surface of the semi-insulating substrate and each of which has a plurality of fingers, a plurality of gate terminal electrodes, a plurality of source terminal electrodes, and a drain terminal electrode which are disposed on the first surface of the semi-insulating substrate and tie a plurality of fingers, respectively for every the gate finger electrode, the source finger electrode, and the drain finger electrode, a VIA hole disposed under the source terminal electrode, and a ground electrode which is disposed on a second surface of the opposite side of the first surface of the semi-insulating substrate, and is connected via the VIA hole to the source terminal electrode; an input circuit pattern and an output circuit pattern which are disposed adjoining of the field effect transistor; an input connecting element configured to connect the plurality of the gate terminal electrodes and the input circuit pattern; and an output connecting element configured to connect the drain terminal electrode and the output circuit pattern, wherein a phase of a transmission signal of the input connecting element is matched by adjusting an inductance distribution of the input connecting element.

According to another aspect of the invention, a high frequency semiconductor device comprises: a field effect transistor including a semi-insulating substrate, a gate finger electrode, a source finger electrode, and a drain finger electrode which are disposed on a first surface of the semi-insulating substrate and each of which has a plurality of fingers, a plurality of gate terminal electrodes, a plurality of source terminal electrodes, and a drain terminal electrode which are disposed on the first surface of the semi-insulating substrate and tie a plurality of fingers, respectively for every the gate finger electrode, the source finger electrode, and the drain finger electrode, a VIA hole disposed under the source terminal electrode, and a ground electrode which is disposed on a second surface of the opposite side of the first surface of the semi-insulating substrate, and is connected via the VIA hole to the source terminal electrode; an input circuit pattern and an output circuit pattern which are disposed adjoining of the field effect transistor; an input connecting element configured to connect the plurality of the gate terminal electrodes and the input circuit pattern; and an output connecting element configured to connect the drain terminal electrode and the output circuit pattern, wherein a phase of a transmission signal of the output connecting element is matched by adjusting an inductance distribution of the output connecting element.

According to another aspect of the invention, a high frequency semiconductor device comprises: a field effect transistor including a semi-insulating substrate, a gate finger electrode, a source finger electrode, and a drain finger electrode which are disposed on a first surface of the semi-insulating substrate and each of which has a plurality of fingers, a plurality of gate extraction electrodes, a plurality of source terminal electrodes, and a drain terminal electrode which are disposed on a first surface of the semi-insulating substrate, and tie a plurality of fingers, respectively for every the gate finger electrode, the source finger electrode, and the drain finger electrode, a VIA hole disposed under the source terminal electrode, and a ground electrode which is disposed on a second surface of the opposite side of the first surface of the semi-insulating substrate, and is connected via the VIA hole to the source terminal electrode; a plurality of input transmission lines which are disposed adjoining of the field effect transistor, and are connected to a plurality of the gate extraction electrodes; and a plurality of output transmission lines which are disposed adjoining of the field effect transistor, and are connected to the drain terminal electrode, wherein a phase of a transmission signal of a plurality of the input transmission lines is matched by adjusting an inductance distribution of the plurality of the input transmission lines.

According to another aspect of the invention, a high frequency semiconductor device comprises: a field effect transistor including a semi-insulating substrate, a gate finger electrode, a source finger electrode, and a drain finger electrode which are disposed on a first surface of the semi-insulating substrate and each of which has a plurality of fingers, a plurality of gate extraction electrodes, a plurality of source terminal electrodes, and a drain terminal electrode which are disposed on a first surface of the semi-insulating substrate, and tie a plurality of fingers, respectively for every the gate finger electrode, the source finger electrode, and the drain finger electrode, a VIA hole disposed under the source terminal electrode, and a ground electrode which is disposed on a second surface of the opposite side of the first surface of the semi-insulating substrate, and is connected via the VIA hole to the source terminal electrode; a plurality of input transmission lines which are disposed adjoining of the field effect transistor, and are connected to a plurality of the gate extraction electrodes; and a plurality of output transmission lines which are disposed adjoining of the field effect transistor, and are connected to the drain terminal electrode, wherein a phase of a transmission signal of the plurality of the output transmission lines is matched by adjusting an inductance distribution of a plurality of the output transmission lines.

ADVANTAGEOUS EFFECTS OF INVENTION

According to the present invention, the high frequency semiconductor device, which makes matching the input/output signal phase by adjusting the inductance distribution of a plurality of the input/output bonding wires or the input/output transmission lines, and improves the gain and the output power, and suppresses the oscillation by unbalanced operation of each FET cell, can be provided.

BRIEF DESCRIPTION OF DRAWINGS

FIG. 18 is a schematic plane pattern configuration diagram of a high frequency semiconductor device according to a modified example of the sixth embodiment of the present invention.

DESCRIPTION OF EMBODIMENTS

Figure 1:
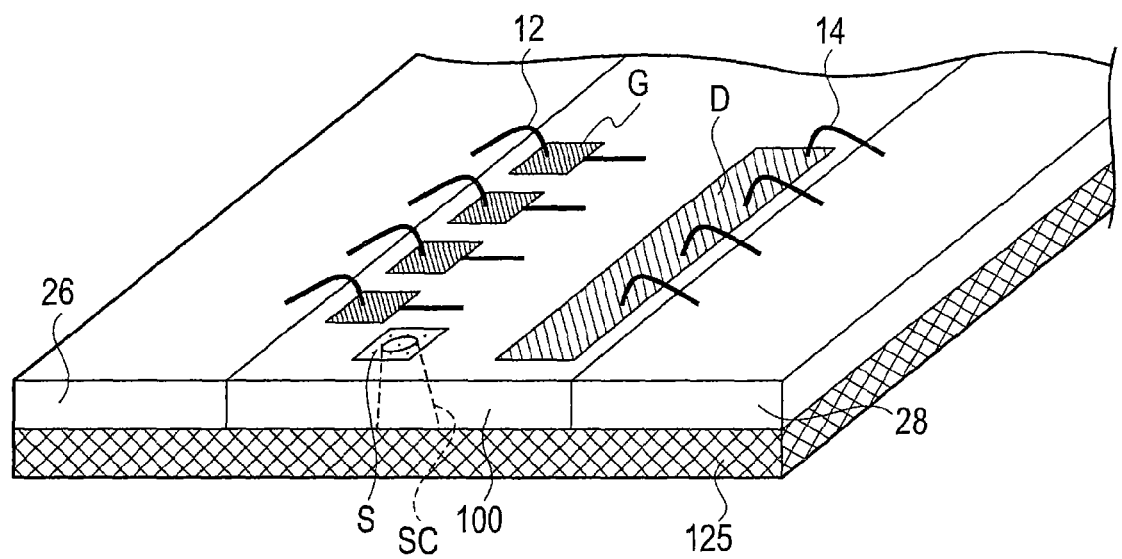
FIG. 1 is a schematic bird's-eye view of a high frequency semiconductor device according to a conventional example.

There will be described embodiments of the present invention, with reference to the drawings, where like members or elements are designated by like reference characters to eliminate redundancy, and some components and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

[First Embodiment]

High Frequency Semiconductor Device

Figure 2:
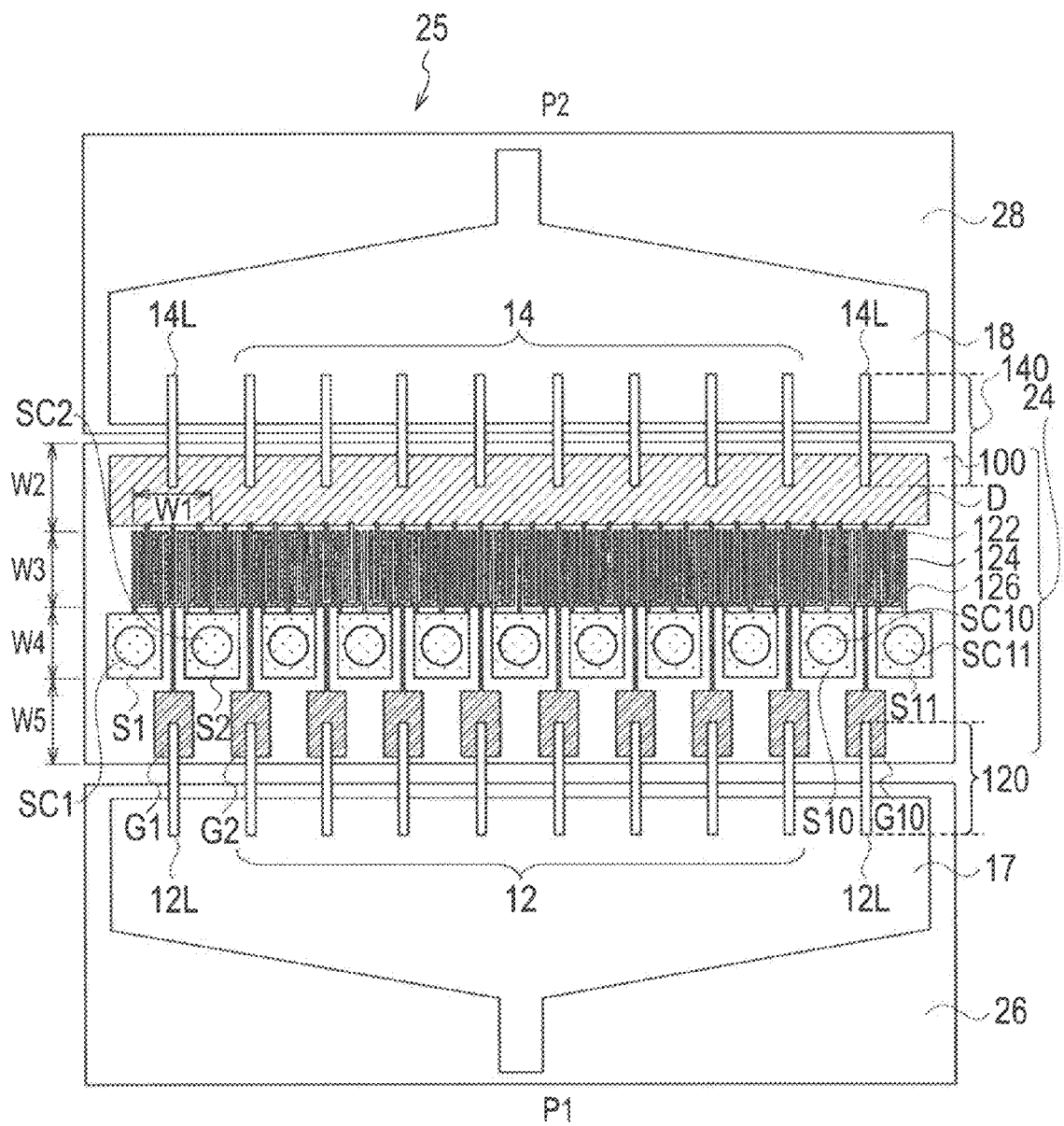
FIG. 2 is a schematic plane pattern configuration diagram of a high frequency semiconductor device according to a first embodiment of the present invention.
Figure 3:
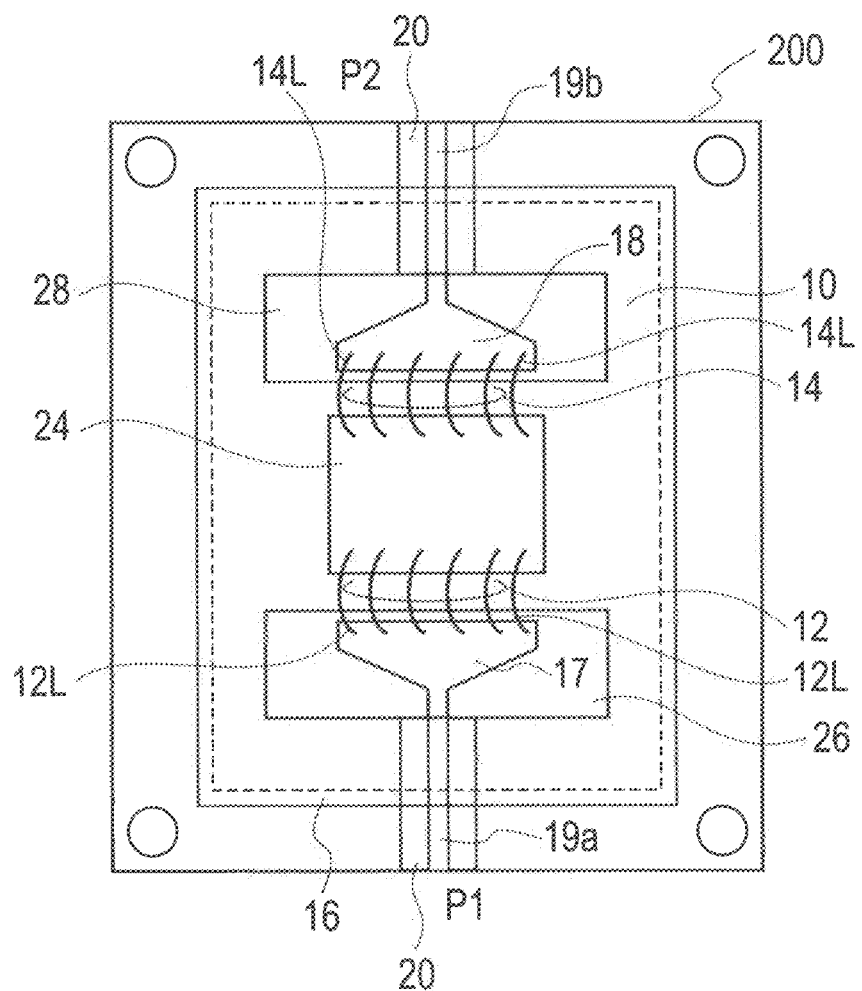
FIG. 3 is a schematic plane pattern configuration diagram of a high frequency package device which mounts the high frequency semiconductor device according to the first embodiment of the present invention.

A schematic plane pattern configuration of a high frequency semiconductor device 25 according to a first embodiment of the present invention is expressed as shown in FIG. 2. Moreover, a schematic plane pattern configuration of a high frequency package device, which mounts the high frequency semiconductor device according to the first embodiment, is expressed as shown in FIG. 3. Moreover, a schematic bird's-eye view of the high frequency semiconductor device according to the first embodiment is expressed as shown in FIG. 4.

Figure 4:
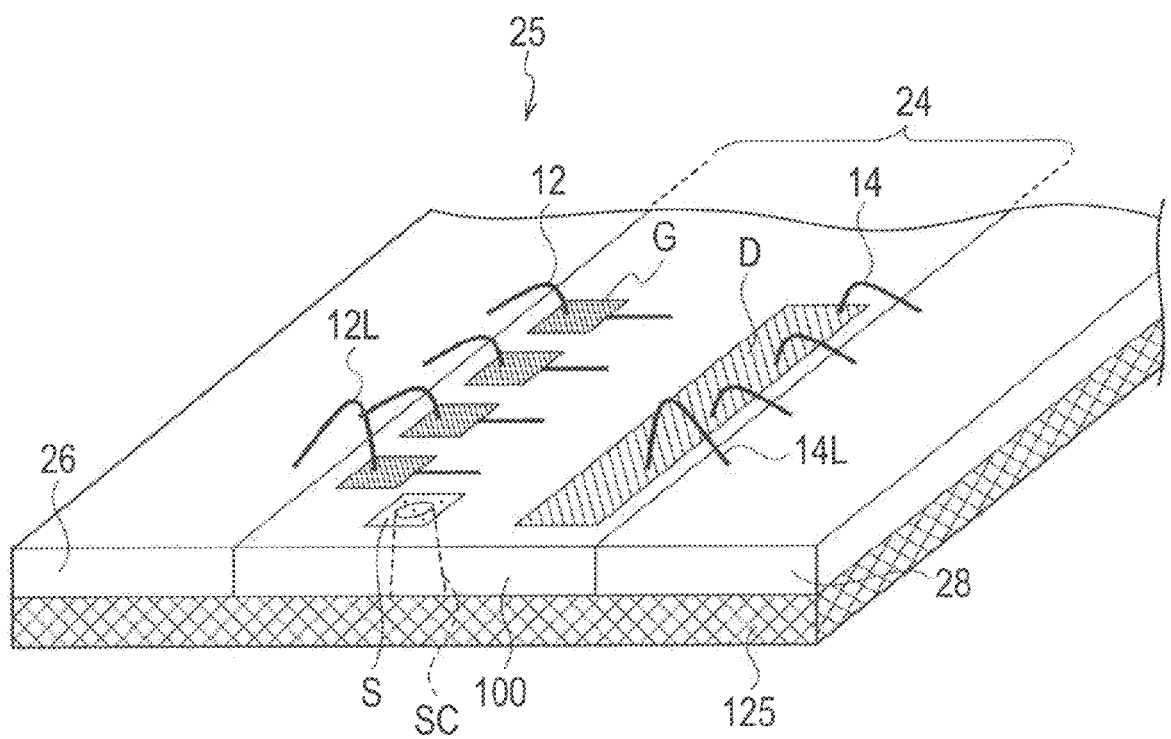
FIG. 4 is a schematic bird's-eye view of the high frequency semiconductor device according to the first embodiment of the present invention.

As shown in FIG. 2 to FIG. 4, the high frequency semiconductor device according to the first embodiment includes: FET 24; an input circuit pattern 17 which is adjoining of the FET 24 and is disposed between an input terminal P1 and the FET 24; an output circuit pattern 18 which is adjoining of the FET 24 and is disposed between an output terminal P2 and the FET 24; an input connecting element 120 for connecting a plurality of gate terminal electrodes G1 to G10 and the input circuit pattern 17; and an output connecting element 140 for connecting a drain terminal electrode D and the output circuit pattern 18.

In the high frequency semiconductor device 25 according to the first embodiment, the input connecting element 120 is composed of a plurality of input bonding wires 12 and 12L, and the output connecting element 140 is composed of a plurality of output bonding wires 14 and 14L.

In the high frequency semiconductor device according to the first embodiment, the FET 24 includes: a semi-insulating substrate 100; a gate finger electrode 124, a source finger electrode 126, and a drain finger electrode 122 which are disposed on a first surface of the semi-insulating substrate 100 and each of which has a plurality of fingers; a plurality of gate terminal electrodes G1 to G10, a plurality of source terminal electrodes S1 to S11 and a drain terminal electrode D which are disposed on the first surface of the semi-insulating substrate 100 and tie a plurality of fingers, respectively every the gate finger electrode 124, the source finger electrode 126, and the drain finger electrode 122; VIA holes SC1 to SC11 disposed under the source terminal electrodes S1 to S11; and a ground conductor 125 which is disposed on a second surface of the opposite side of the first surface of the semi-insulating substrate 100, and is connected via the VIA holes SC1 to SC11 to the source terminal electrodes S1 to S11.

In the configuration example of FIG. 2, as for the size of each part, for example, the cell width W1 is about 120 μm, W2 is about 80 μm, the cell length W3 is about 100 μm, W4 and W5 are about 120 μm, and the gate width is 100 μm×6×10 cell=6.0 mm as a whole.

In the high frequency semiconductor device according to the first embodiment, the phase of a transmission signal of a plurality of the input bonding wires 12 and 12L is matched by adjusting the inductance distribution of a plurality of the input bonding wires 12 and 12L, and the phase of a transmission signal of a plurality of the output bonding wires 14 and 14L is matched by adjusting the inductance distribution of a plurality of the output bonding wires 14 and 14L.

In the high frequency semiconductor device 25 according to the first embodiment, the inductance of the input bonding wires 12L connected to edge parts (relative to a row of the plurality of input bonding wires) of the input circuit pattern 17 is uniformed with an inductance of the input bonding wires 12 connected to a part other than the edge parts of the input circuit pattern 17. In the high frequency semiconductor device 25 according to the first embodiment, the inductance of the output bonding wires 14L connected to edge parts (relative to a row of the plurality of output bonding wires) of the output circuit pattern 18 is uniformed with an inductance of the output bonding wires 14 connected to a part other than the edge parts of the output circuit pattern 18.

More specifically, in the high frequency semiconductor device 25 according to the first embodiment, the length of the input bonding wires 12L connected to edge parts of the input circuit pattern 17 is longer than the length of the input bonding wires 12 connected to the part other than the edge parts. More specifically, in the high frequency semiconductor device 25 according to the first embodiment, the length of the output bonding wires 14L connected to edge parts of the output circuit pattern 18 is longer than the length of the output bonding wires 14 connected to the part other than the edge parts.

(High Frequency Package Device)

As shown in FIG. 3, the schematic plane pattern configuration of the high frequency package device according to the first embodiment includes: a substrate 200; the FET 24 disposed on the substrate 200; the input circuit pattern 17 which is disposed at the input terminal P1 of the FET 24 and is disposed on a dielectric substrate 26; the output circuit pattern 18 which is disposed at the output terminal P2 of the FET 24 and is disposed on a dielectric substrate 28; an input stripline 19a which is connected to the input circuit pattern 17 and is disposed on an insulating layer 20; an output stripline 19b which is connected to the output circuit pattern 18 and is disposed on the insulating layer 20; a ceramic wall 16 for containing the FET 24, the input circuit pattern 17, the output circuit pattern 18, a part of the input stripline 19a, and a part of the output stripline 19b; and a ceramic cap 10 disposed on the ceramic wall 16 via a solder metal layer and a metal layer pattern.

A plurality of the input bonding wires 12 and 12L are connected between the FET 24 and the input circuit pattern 17, and a plurality of the output bonding wires 14 and 14L are connected between the FET 24 and the output circuit pattern 18.

(Mutual Inductance)

In the high frequency semiconductor device related to a first embodiment, the phase of the transmission signal of a plurality of the input bonding wires 12 and 12L is matched by adjusting the inductance distribution of a plurality of the input bonding wires 12 and 12L disposed in parallel substantially. Since the mutual inductance is varied according to the distance between a plurality of the input bonding wires 12 and 12L disposed in parallel, the adjustment of this distance is important. Similarly, in the high frequency semiconductor device according to the first embodiment, the phase of the transmission signal of a plurality of the output bonding wires 14 and 14L is matched by adjusting the inductance distribution of a plurality of the output bonding wires 14 and 14L disposed in parallel substantially. Therefore, the adjustment of the distance between a plurality of the output bonding wires 14 and 14L disposed in parallel is important.

Figure 5:
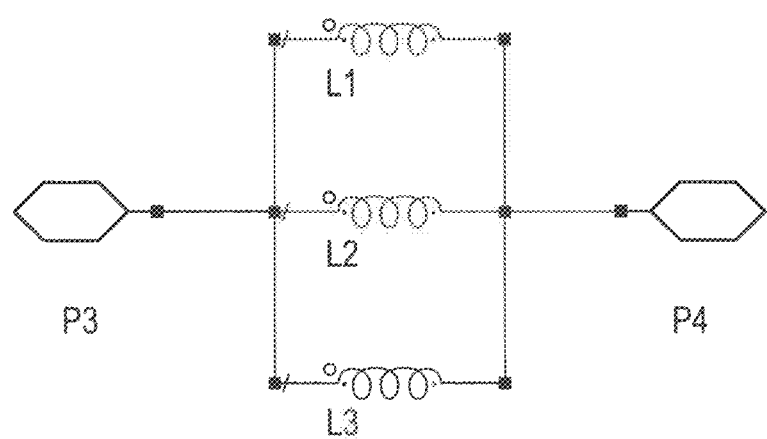
FIG. 5 is a schematic circuit configuration diagram for explaining an effect of mutual inductance.

A schematic circuit configuration for explaining the effect of the mutual inductance is expressed using an example by which inductances L1, L2, and L3 are disposed in parallel between a terminal P3 and a terminal P4, as shown in FIG. 5.

First of all, when there is no mutual inductance, $L1=L2=L3=L0$ is satisfied.

Next, when the mutual inductance M12 exists between the inductance L1 and the inductance L2 and the mutual inductance M23 exists between the inductance L2 and the inductance L3, $L1=L0+M12$, $L2=L0+M12+M23$, and $L3=L0+M23$ are satisfied. In this case, the mutual inductance M31 between the inductance L3 and the inductance L1 is ignored noting that it is extremely small compared with M12 and M23.

Figure 6:
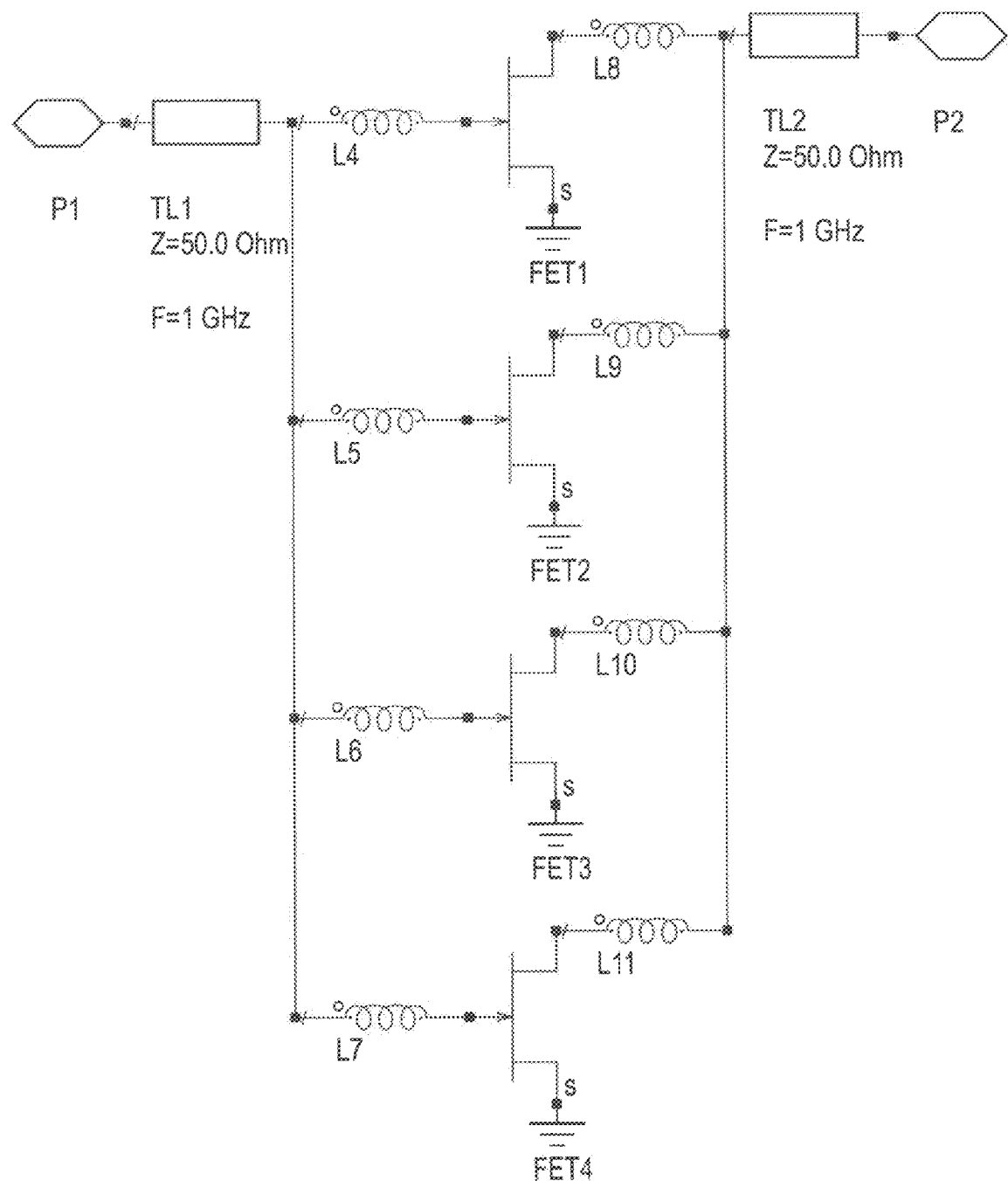
FIG. 6 is a schematic circuit configuration diagram which takes the mutual inductance into consideration in the high frequency semiconductor device according to the first embodiment of the present invention.

As shown in FIG. 6, in the high frequency semiconductor device according to the first embodiment, an example of a schematic circuit configuration in consideration of mutual inductance includes: a stripline TL1 connected to an input terminal P1; a stripline TL2 connected to an output terminal P2; FET1 to FET4 which are disposed in parallel between the input terminal P1 and the output terminal P2; inductances L4 to L7 connected between the stripline TL1 and the gates of the FET1 to FET4; and inductances L8 to L11 connected between the drain of FET1 to FET4 and the stripline TL2. In the above-mentioned configuration example, although the example to which parallel connection of four FET is performed is shown, the number of the FET is not limited to four pieces and chosen according to the current capacity of the high frequency semiconductor device.

First of all, when there is no mutual inductance, $L4=L5=L6=L7=Lin$ and $L8=L9=L10=L11=Lout$ is satisfied.

Next, when the mutual inductance M45 exists between the inductance L4 and the inductance L5, the mutual inductance M56 exists between the inductance L5 and the inductance L6, and the mutual inductance M67 exists between the inductance L6 and the inductance L7, $L4=Lin+M45$, $L5=Lin+M45+M56$, $L6=Lin+M56+M67$, and $L7=Lin+M67$ are satisfied.

Similarly, when the mutual inductance M89 exists between the inductance L8 and the inductance L9, the mutual inductance M910 exists between the inductance L9 and the inductance L10, and the mutual inductance M1011 exists between the inductance L10 and the inductance L11, $L8=Lout+M89$, $L9=Lout+M89+M910$, $L10=Lout+M910+M1011$, and $L11=Lout+M1011$ are satisfied. In this case, the mutual inductance M64 between the inductance L6 and the inductance L4, the mutual inductance M74 between the inductance L7 and the inductance L4, and the mutual inductance M75 between the inductance L7 and the inductance L5, or the mutual inductance M108 between the inductance L10 and the inductance L8, the mutual inductance M118 between the inductance L11 and the inductance L8, and the mutual inductance M119 between the inductance L11 and the inductance L9 is ignored noting that it is extremely small compared with the mutual inductance between the adjoining inductances.

In the high frequency semiconductor device according to the first embodiment, the inductance distribution is adjusted in consideration of the mutual inductance of a plurality of the input bonding wires 12 and 12L disposed in parallel substantially. Similarly, the inductance distribution is adjusted in consideration of the mutual inductance of a plurality of the output bonding wires 14 and 14L disposed in parallel substantially.

(Result of Experiment)

Figure 7:
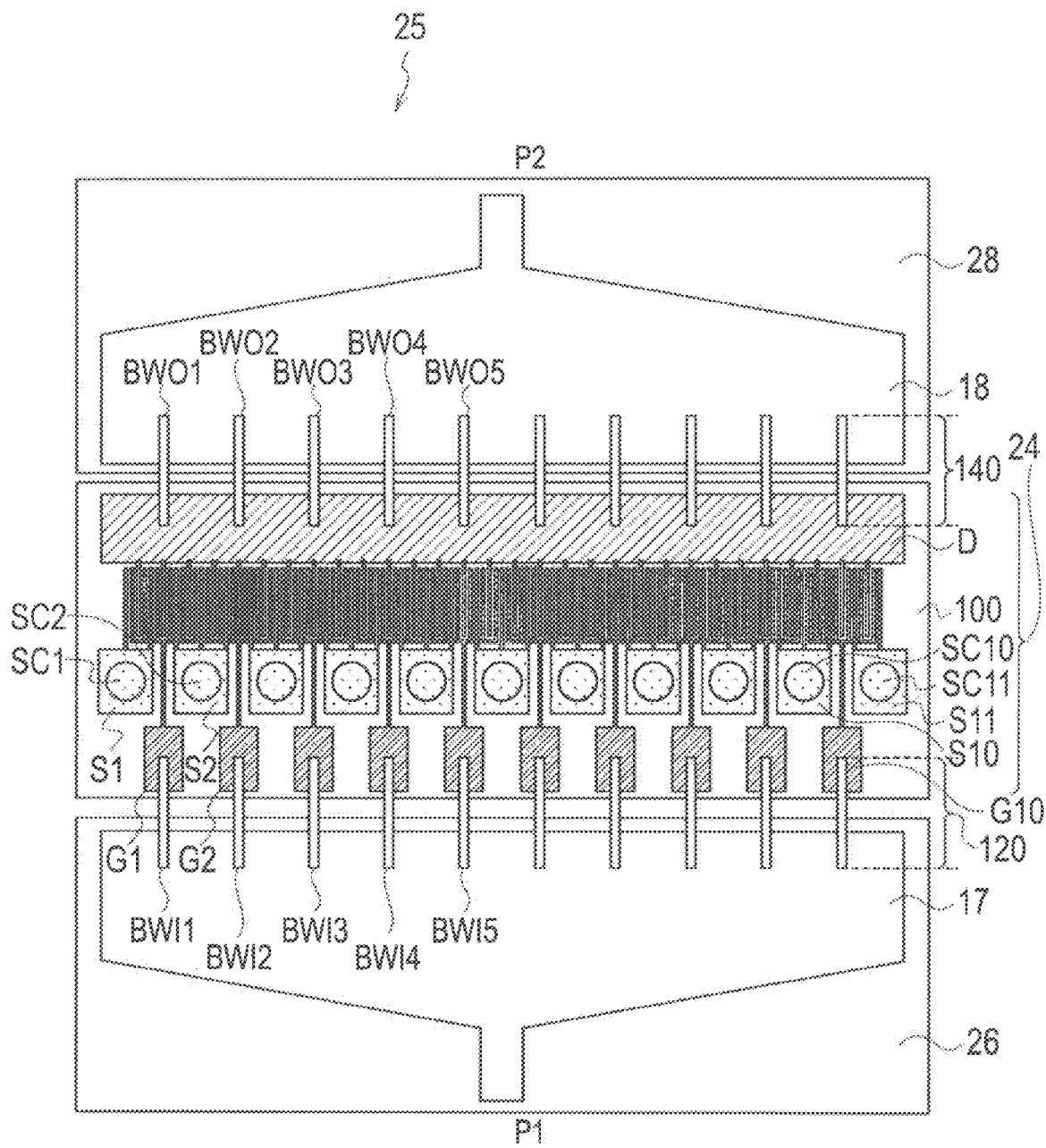
FIG. 7 is an explanatory diagram of the position of each input bonding wire BWI1 to BWI5, in the schematic plane pattern configuration of a high frequency semiconductor device applied to an experiment of the present invention.

In a schematic plane pattern configuration applied to an experiment of the high frequency semiconductor device according to the first embodiment, the position of each input bonding wire BWI1 to BWI5 and each output bonding wire BWO1 to BWO5 is expressed as shown in FIG. 7.

Figure 8:
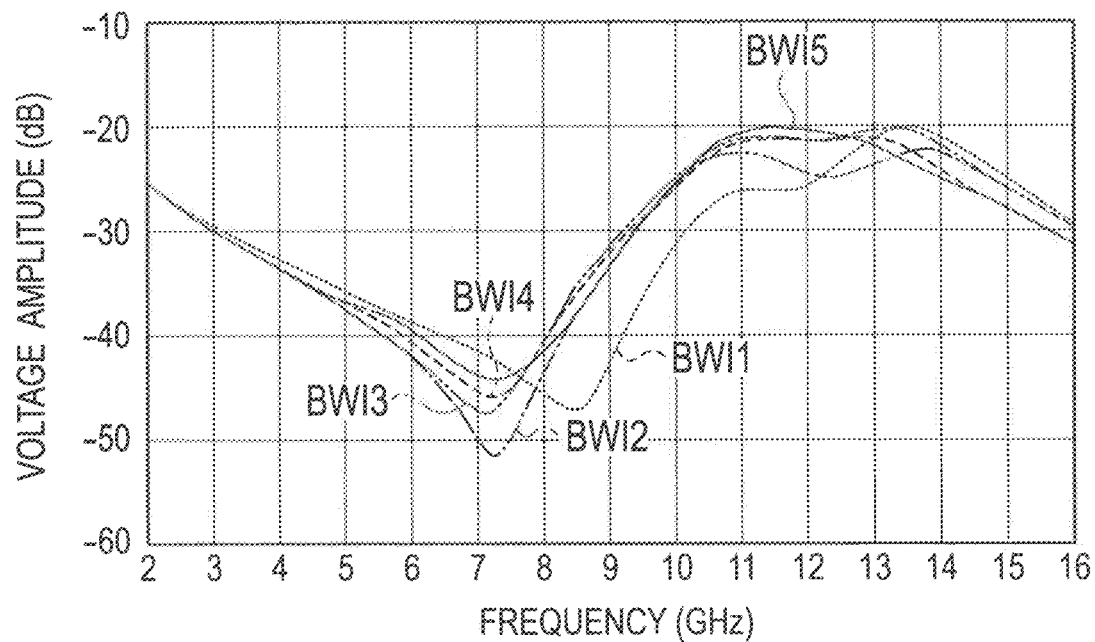
FIG. 8 is an explanatory diagram of the relation of voltage amplitude (dB) and frequency (GHz) for each input bonding wire BWI1 to BWI5, in a high frequency semiconductor device according to a comparative example of the present invention.

In the high frequency semiconductor device according to a comparative example of the present invention, the relation of the voltage amplitude (dB) and the frequency (GHz) for each input bonding wire BWI1 to BWI5 is expressed as shown in FIG. 8. On the other hand, in the high frequency semiconductor device according to the first embodiment, the relation of the voltage amplitude (dB) and the frequency (GHz) for each input bonding wire BWI1 to BWI5, which adjusts the value of inductance, is expressed as shown in FIG. 9.

In the comparative example shown in FIG. 8, the inductance distribution is not adjusted in consideration of the mutual inductance of a plurality of the input bonding wire BWI1 to BWI5 and a plurality of the output bonding wire BWO1 to BWO5 disposed in parallel. Accordingly, the phase difference occurs in each input bonding wire BWI1 to BWI5. That is, since the inductance component of the input bonding wire BWI1 of the endmost part has the substantially small mutual inductance component as compared with other input bonding wire BWI2 to BWI5, among a plurality of the input bonding wire BWI1 to BWI5 and a plurality of the output bonding wire BWO1 to BWO5 disposed in parallel, it becomes small. Accordingly, in the input bonding wires BWI1 to BWI5 and the output bonding wires BWO1 to BWO5, since the variation in the inductance occurs, as shown in FIG. 8, remarkable phase difference is detected in the input bonding wire BWI1.

Figure 9:
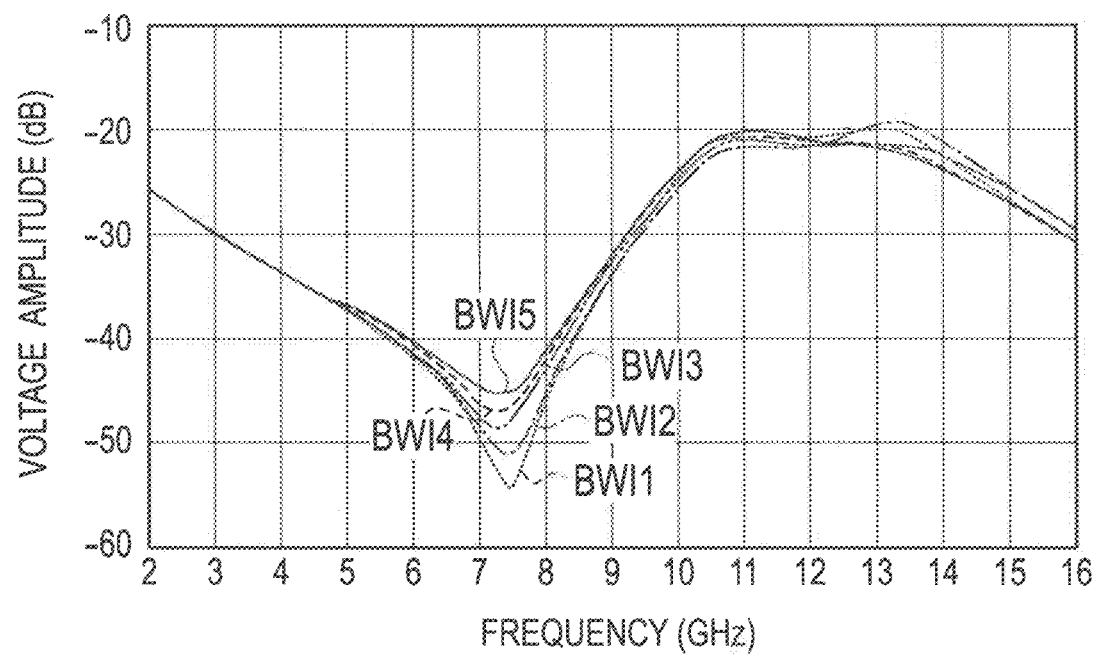
FIG. 9 is an explanatory diagram of the relation of voltage amplitude (dB) and frequency (GHz) for each input bonding wire BWI1 to BWI5 which adjusts the value of inductance, in the high frequency semiconductor device of the present invention.

On the other hand, the example which makes the length of the input bonding wire BWI1 for ten percent (10%) longer, compared with other input bonding wires BWI2 to BWI5, corresponds to FIG. 9. As clearly from FIG. 9, by setting up the length of the input bonding wire BWI1 ten percent (10%) longer compared with other input bonding wires BWI2 to BWI5, it proves that the variation in the mutual inductance can be canceled and the inductance distribution can be adjusted, in a plurality of the input bonding wire BWI1 to BWI5 and a plurality of the output bonding wire BWO1 to BWO5 disposed in parallel substantially.

The phase adjustment of the input output signal can be performed by the length of the input bonding wire BWI1 connected to edge parts of the input circuit pattern 17 ten percent (10%) longer than the length of the input bonding wires BWI2 to BWI5 of the central part among a plurality of the input bonding wires BWI1 to BWI5, and setting up the length of the output bonding wire BWO1 connected to edge parts of the output circuit pattern 18 ten percent (10%) longer than the length of the output bonding wires BWO2 to BWO5 of the central part.

That is, in the high frequency semiconductor device according to the first embodiment, the length of the input bonding wire 12L connected to the edge part of the plurality of the input bonding wires 12 may be longer than the length of other input bonding wires 12 connected to the part other than the edge parts. Similarly, the length of the output bonding wire 14L connected to the edge part of the plurality of the output bonding wires 14 may be longer than the length of other output bonding wires 14 connected to the part other than the edge parts.

In the high frequency semiconductor device according to the first embodiment, the length of only one of the input bonding wire 12L at each edge of the plurality of the input bonding wires 12 may be longer than the length of other input bonding wires 12. Similarly, the length of only one of the output bonding wire 14L at each edge of the plurality of the output bonding wires 14 may be longer than the length of other output bonding wires 14.

Alternately, in the high frequency semiconductor device according to the first embodiment, the length of only one of the input bonding wire 12L at each edge of the plurality of the input bonding wires 12 may be ten percent (10%) longer than the length of the other input bonding wires 12. Similarly, the length of only one of the output bonding wire 14L at each edge of the plurality of the output bonding wires 14 may be ten percent (10%) longer than the length of the other output bonding wires 14.

In addition, although the example which adjusts the length of only one of the input bonding wire 12L of the both ends of the input circuit pattern 17 among a plurality of the input bonding wires 12 and 12L, and the example which adjusts the length of only one of the output bonding wire 14L of the both ends of the output circuit pattern 18 among a plurality of the output bonding wires 14 and 14L are explained, the number of the bonding wire which should be adjusted is not limited to only one. The number of the needed bonding wire of length adjustment becomes an increasing tendency in proportion as the interval of the bonding wire disposed in parallel becomes narrow.

Moreover, although the example which makes the length of the input bonding wire 12L of the both ends of the input circuit pattern 17 ten percent (10%) longer than the length of the input bonding wires 12 of the central part among a plurality of the input bonding wires 12 and 12L, and the example which makes the length of the output bonding wire 14L of the both ends of the output circuit pattern 18 ten percent (10%) longer than the length of the output bonding wires 14 of the central part among a plurality of output bonding wires 14 and 14L are explained, the rate of the length of the bonding wire which should be adjusted is not limited to ten percent (10%). Since the value of the mutual inductance becomes large in proportion as the interval of the bonding wire disposed in parallel becomes narrow, it becomes the tendency for the range of longitudinal adjustment width to increase.

In the high frequency semiconductor device according to the first embodiment, the phase of the transmission signal of a plurality of the input bonding wires 12 and 12L can be uniformed by adjusting the inductance distribution of a plurality of the input bonding wires 12 and 12L, and the phase of the transmission signal of a plurality of the output bonding wires 14 and 14L can be uniformed by adjusting the inductance distribution of a plurality of the output bonding wires 14 and 14L.

Moreover, the input circuit pattern 17 and the output circuit pattern 18 can also be composed by the microwave transmission line provided on the dielectric substrates 26 and 28 which is disposed adjoining of the FET 24.

Moreover, in the FET 24 applied to the high frequency semiconductor device according to the first embodiment, the semi-insulating substrate 100 can be composed by any one of a GaAs substrate, a SiC substrate, a GaN substrate, the substrate in which a GaN epitaxial layer is formed on a SiC substrate, the substrate in which the heterojunction epitaxial layer composed of GaN/AlGaN is formed on a SiC substrate, a sapphire substrate, or a diamond substrate, for example.

(Wilkinson Coupled Circuit)

In the high frequency semiconductor device according to the first embodiment, the input circuit pattern 17 may provide a Wilkinson coupled circuit for the FET 24. Similarly, the output circuit pattern 18 may provide a Wilkinson coupled circuit for the FET 24.

Figure 10:
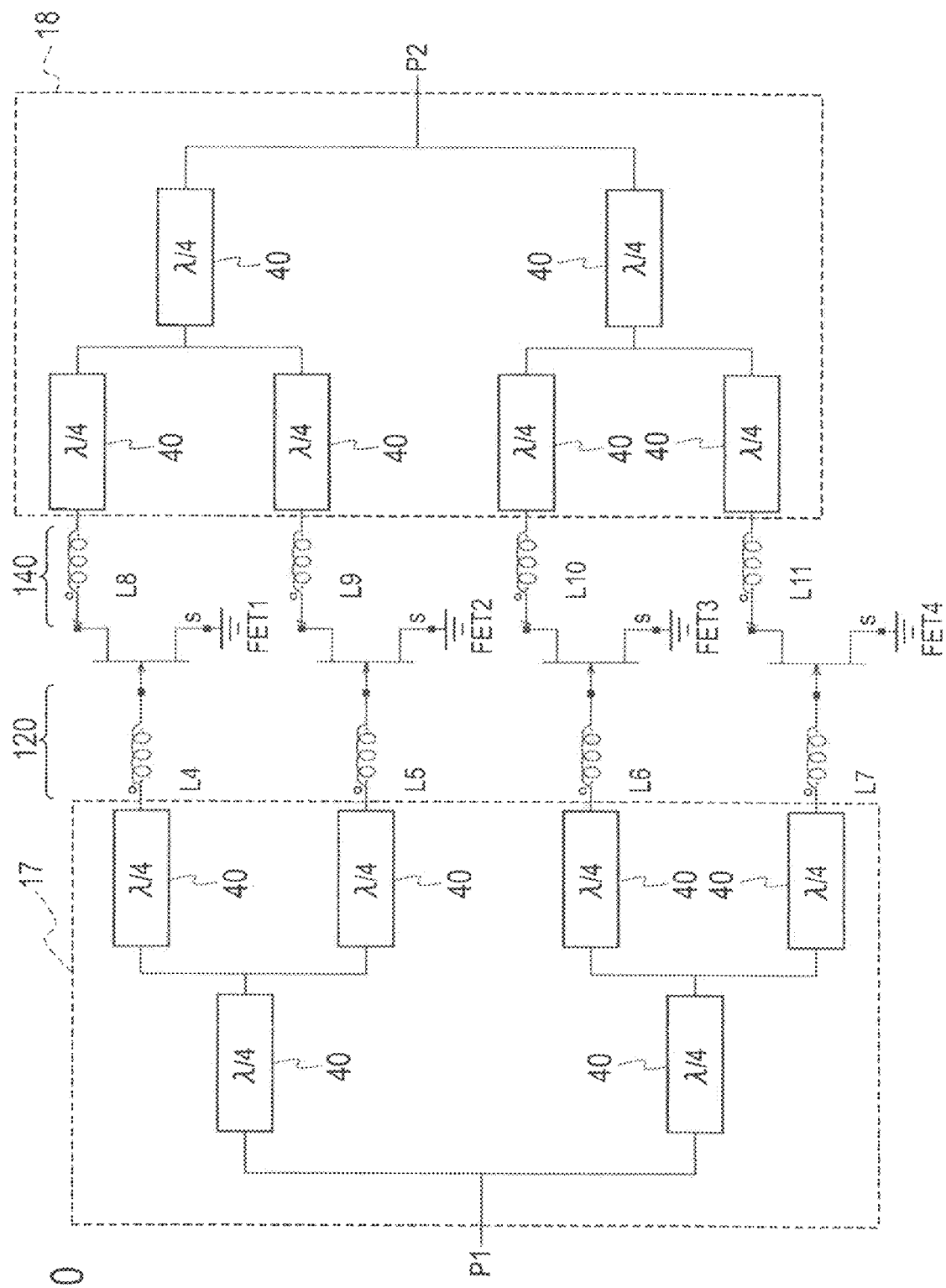
FIG. 10 is a schematic circuit configuration diagram to which the Wilkinson coupled circuit is applied as an input circuit pattern and an output circuit pattern, in the high frequency semiconductor device according to the first embodiment of the present invention.

In the high frequency semiconductor device according to the first embodiment, as the input circuit pattern 17 disposed on the dielectric substrate 26 and the output circuit pattern 18 disposed on the dielectric substrate 28, a schematic circuit configuration to which the Wilkinson coupled circuit is applied is expressed as shown in FIG. 10.

As shown in FIG. 10, by composing the input circuit pattern 17 connected between the input terminal P1 and the inductances L4 to L7 by the Wilkinson coupled circuit composed of a quarter wavelength stripline 40, it can input in parallel for the FET1 to FET4 connected in parallel by phase matching the input signal power, performing impedance conversion to 50Ω. Similarly, by composing the output circuit pattern 18 connected between the output terminal P2 and the inductances L8 to L11 by the Wilkinson coupled circuit composed of the quarter wavelength stripline 40, it can output in parallel from the FET1 to FET4 by which connected in parallel by phase matching the output signal power, performing impedance conversion to 50 Ω.

(Modified Example)

Figure 11:
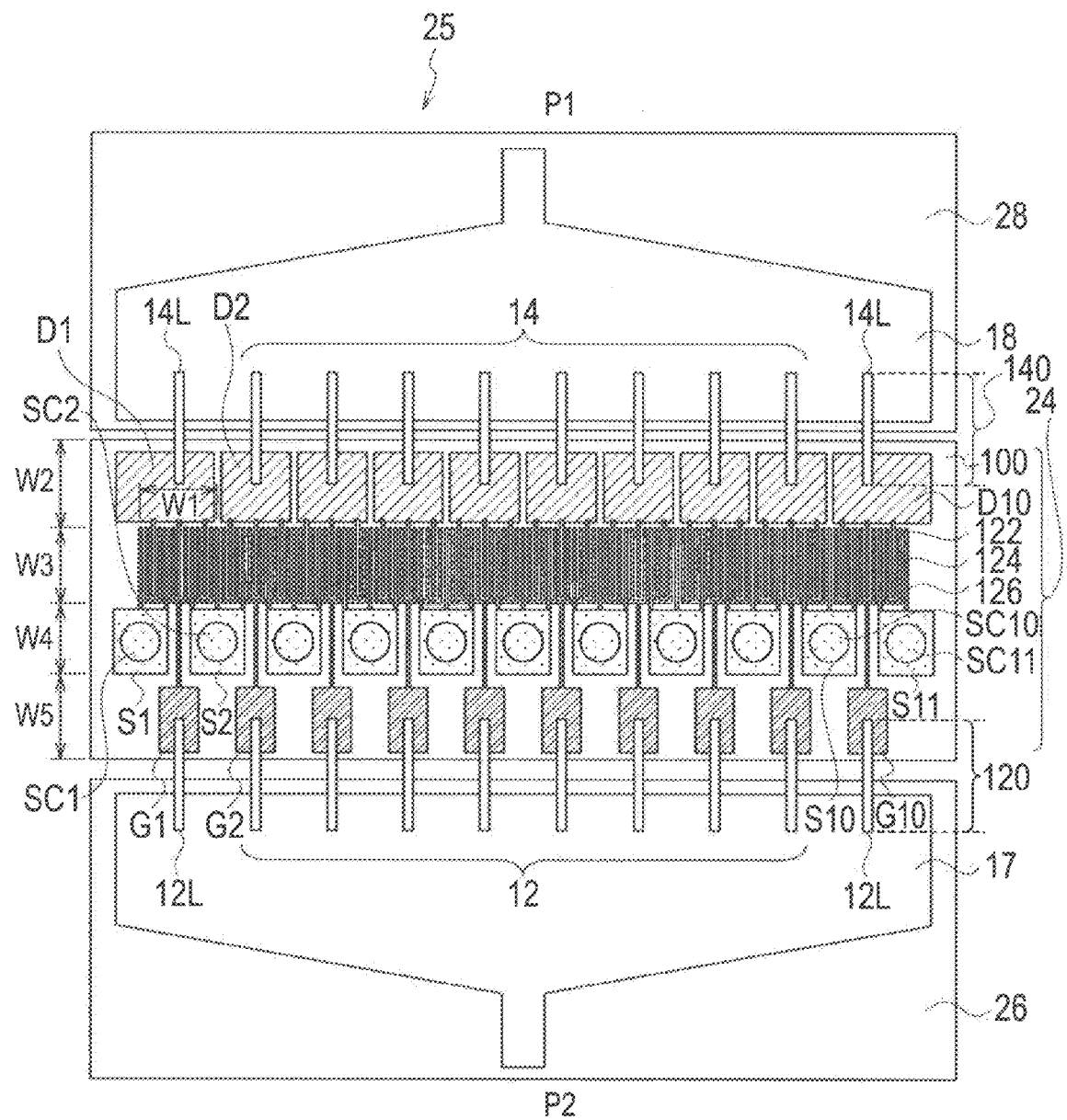
FIG. 11 is a schematic plane pattern configuration diagram of a high frequency semiconductor device according to a modified example of the first embodiment of the present invention.
Figure 12:
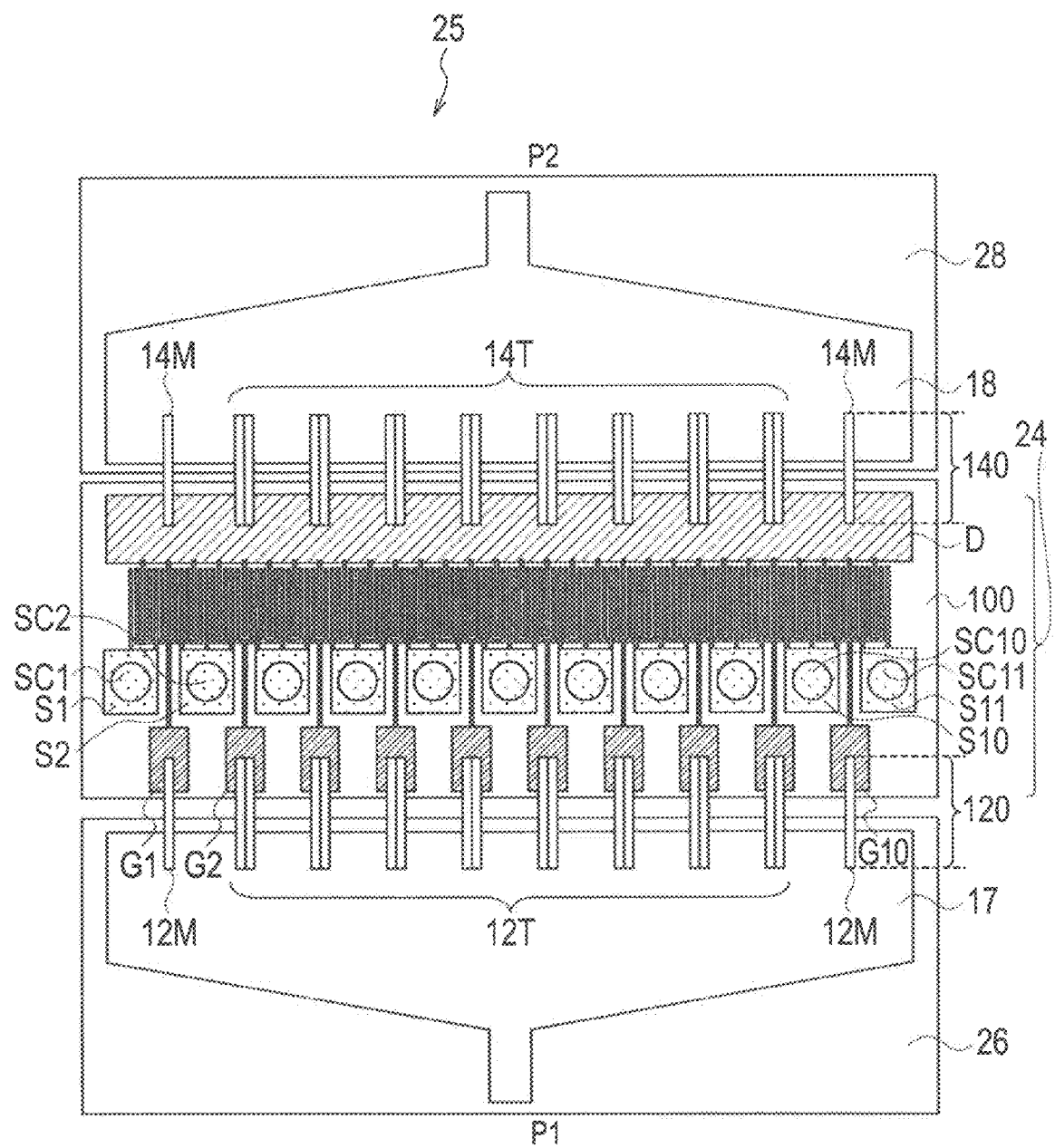
FIG. 12 is a schematic plane pattern configuration diagram of a high frequency semiconductor device according to a second embodiment of the present invention.

As shown in FIG. 11, a high frequency semiconductor device according to a modified example of the first embodiment includes: an FET 24; an input circuit pattern 17 and an output circuit pattern 18 which are disposed adjoining of the FET; an input connecting element 120 for connecting a plurality of gate terminal electrodes G1 to G10 and the input circuit pattern 17; and an output connecting element 140 for connecting a plurality of drain terminal electrodes D1 to D10 and the output circuit pattern 18.

In the high frequency semiconductor device 25 according to the modified example of the first embodiment, the input connecting element 120 comprises of a plurality of input bonding wires 12 and 12L, and the output connecting element 140 comprises of a plurality of output bonding wires 14 and 14L.

In the high frequency semiconductor device 25 according to the modified example of the first embodiment, the FET 24 includes: a semi-insulating substrate 100; a gate finger electrode 124, a source finger electrode 126, and a drain finger electrode 122 which are disposed on a first surface of the semi-insulating substrate 100, and have a plurality of fingers, respectively; a plurality of gate terminal electrodes G1 to G10, a plurality of source terminal electrodes S1 to S11, and a plurality of drain terminal electrodes D1 to D10 which are disposed on the first surface of the semi-insulating substrate 100, and tie a plurality of fingers, respectively every the gate finger electrode 124, the source finger electrode 126, and the drain finger electrode 122, VIA holes SC1 to SC11 disposed under the source terminal electrodes S1 to S11; and a ground conductor 125 which is disposed on a second surface of the opposite side of the first surface of the semi-insulating substrate 100, and is connected through the VIA holes SC1 to SC11 with the source terminal electrodes S1 to S11.

In the high frequency semiconductor device 25 according to the modified example of the first embodiment, it is characterized by the point that the drain terminal electrodes D1 to D10 are divided, and other configurations are the same as that of the first embodiment.

According to the first embodiment and its modified example, the high frequency semiconductor device, which matches the input/output signal phase by adjusting the inductance distribution of a plurality of the input/output bonding wires, improves the gain and the output power, and suppresses the oscillation by unbalanced operation of each FET cell, can be provided.

[Second Embodiment]

In the high frequency semiconductor device according to the second embodiment, a diameter of the input bonding wires 12M connected to edge parts of the input circuit pattern 17 may be shorter than a diameter of the input bonding wires 12T connected to a part other than the edge parts, and the plurality of the input bonding wires may be ten percent (10%) longer than a case that the plurality of the input bonding wires have a same diameter. Similarly, a diameter of the output bonding wires 14M connected to edge parts of the output circuit pattern 18 may be shorter than a diameter of the output bonding wires 14T connected to a part other than the edge parts, and the plurality of the output bonding wires may be ten percent (10%) longer than a case that the plurality of the output bonding wires have a same diameter.

Furthermore, in the high frequency semiconductor device according to the second embodiment, a diameter of one input bonding wire 12M at each edge of the plurality of the input bonding wires may be shorter than a diameter of other input bonding wires 12T. Similarly, a diameter of one output bonding wire 14M at each edge of the plurality of the output bonding wires may be shorter than a diameter of other output bonding wires 14T.

(Design of Bonding Wire Diameter)

The variation of the inductance by the diameter of the bonding wire can be estimated as characteristic impedance of the Ressel line.

The characteristic impedance Z of the Ressel line is expressed by $Z=120\ln(2d/a)$, where the diameter of the bonding wire is a, and the height of the bonding wire for ground plane is d/2.

In the case where the characteristic impedance Z is written with the inductance L and the capacitance C, the inductance L is expressed by $L=Z^2 \cdot C$ according to $Z=(L/C)^{1/2}$.

Since the inductance L and the light velocity v are expressed by $v=1/(LC)^{1/2}$, and $L=1/C \cdot (1/v^2)$, it is expressed by $L=Z/v=1/v \cdot 120\ln(2d/a)$.

For example, what is necessary is for the diameter a of the bonding wire just to be about 33 μm, in order to decrease the inductance about 10%, when the diameter a of the bonding wire of the circumference which is in a height of about 100 μm from ground plane is 25 μm.

According to the second embodiment, the high frequency semiconductor device, which matches the input/output signal phase by adjusting the inductance distribution of a plurality of the input/output bonding wires, improves the gain and the output power, and suppresses the oscillation by unbalanced operation of each FET cell, can be provided.

[Third Embodiment]

Figure 13:
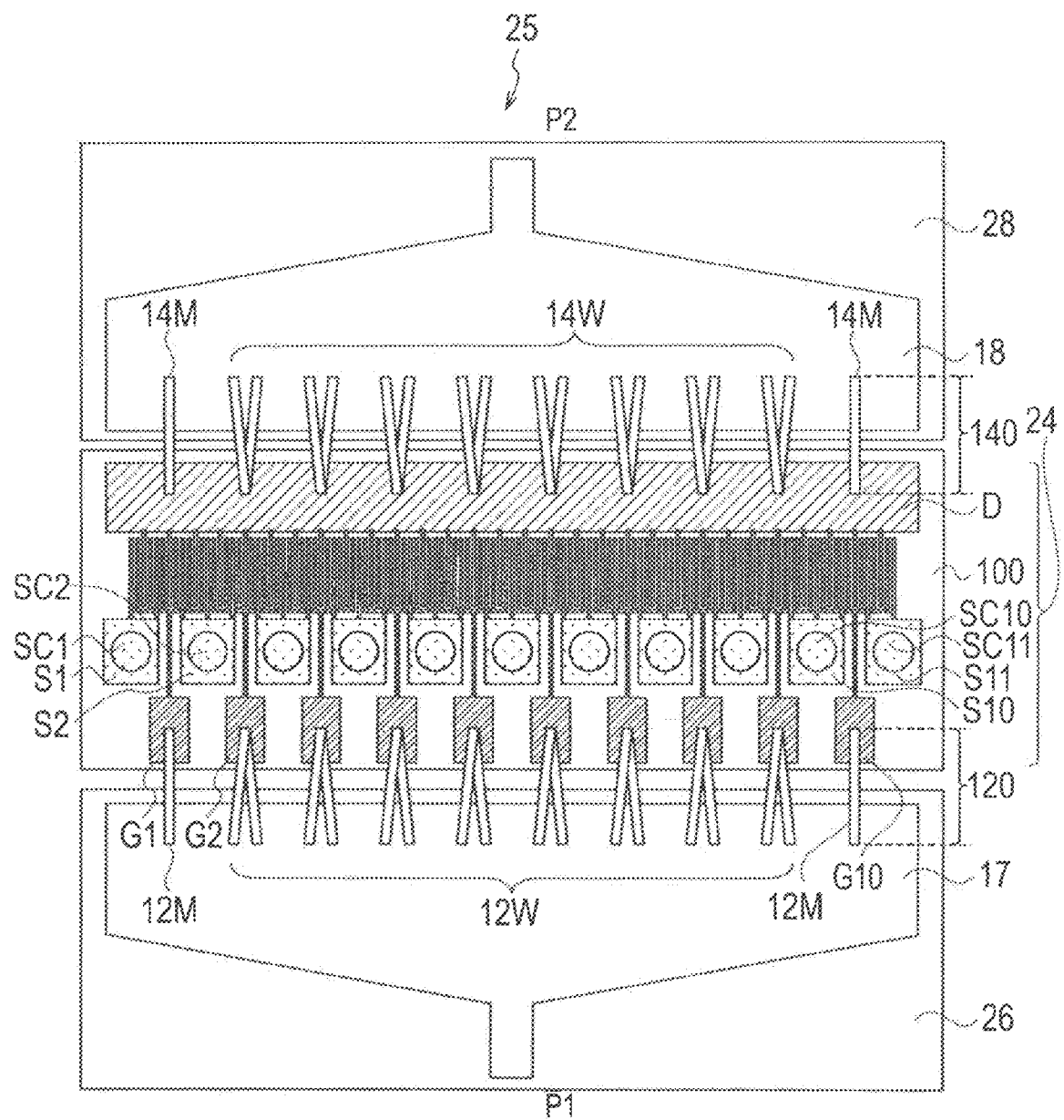
FIG. 13 is a schematic plane pattern configuration diagram of a high frequency semiconductor device according to a third embodiment of the present invention.

As shown in FIG. 13, a schematic plane pattern configuration of a high frequency semiconductor device according to a third embodiment is characterized in that: the number of the input bonding wires 12W of the central part of the input circuit pattern 17 is set to two, i.e. the twice of the number of the input bonding wires 12M connected to edge parts of the input circuit pattern 17, among a plurality of the input bonding wires 12M and 12W; and the number of the output bonding wires 14W of the central part of the output circuit pattern 18 is set to two, i.e. the twice of the number of the output bonding wires 14M connected to edge parts of the output circuit pattern 18, among a plurality of the output bonding wires 14M and 14W. Other configurations are the same as that of the high frequency semiconductor device according to the first embodiment.

That is, in the high frequency semiconductor device according to the third embodiment, input bonding wires 12W other than one input bonding wire 12M at each edge of the plurality of the input bonding wires are provided by a set of two input bonding wires. Similarly, output bonding wires 14W other than one output bonding wire 14 at each edge of the plurality of the output bonding wires are provided by a set of two output bonding wires.

In the high frequency semiconductor device according to the third embodiment, the interval of the two input bonding wires 12T of the central part of the input circuit pattern 17 may be narrow, in proportion as to approach edge parts of the input circuit pattern 17, and the interval of the two output bonding wire 14T of the central part of the output circuit pattern 18 may be narrow, in proportion as to approach the edge parts of the output circuit pattern 18. By setting up in this way, the phase of the input signal, which spreads a plurality of the input bonding wires 12M and 12T, can be equalized by adjusting the inductance distribution of a plurality of the input bonding wires 12M and 12T. By setting up in this way, the phase of the output signal, which spreads a plurality of the output bonding wires 14M and 14T, can be similarly equalized by adjusting the inductance distribution of a plurality of the output bonding wires 14M and 14T.

That is, in each set of the two input bonding wires, the two input bonding wires are connected to one of the gate terminal electrodes G2~G9 in a closed manner and to the input circuit pattern 17 in an open manner, an interval in the open manner being narrower towards edge parts of the plurality of the input bonding wires 12W. Similarly, in each set of the two output bonding wires, the two output bonding wires are connected to the drain terminal electrode D in a closed manner and to the output circuit pattern 18 in an open manner, an interval in the open manner being narrower towards edge parts of the plurality of the output bonding wires 14W.

According to the third embodiment, the high frequency semiconductor device, which matches the input/output signal phase by adjusting the inductance distribution of a plurality of the input/output bonding wires, improves the gain and the output power, and suppresses the oscillation by unbalanced operation of each FET cell, can be provided.

[Fourth Embodiment]

Figure 14:
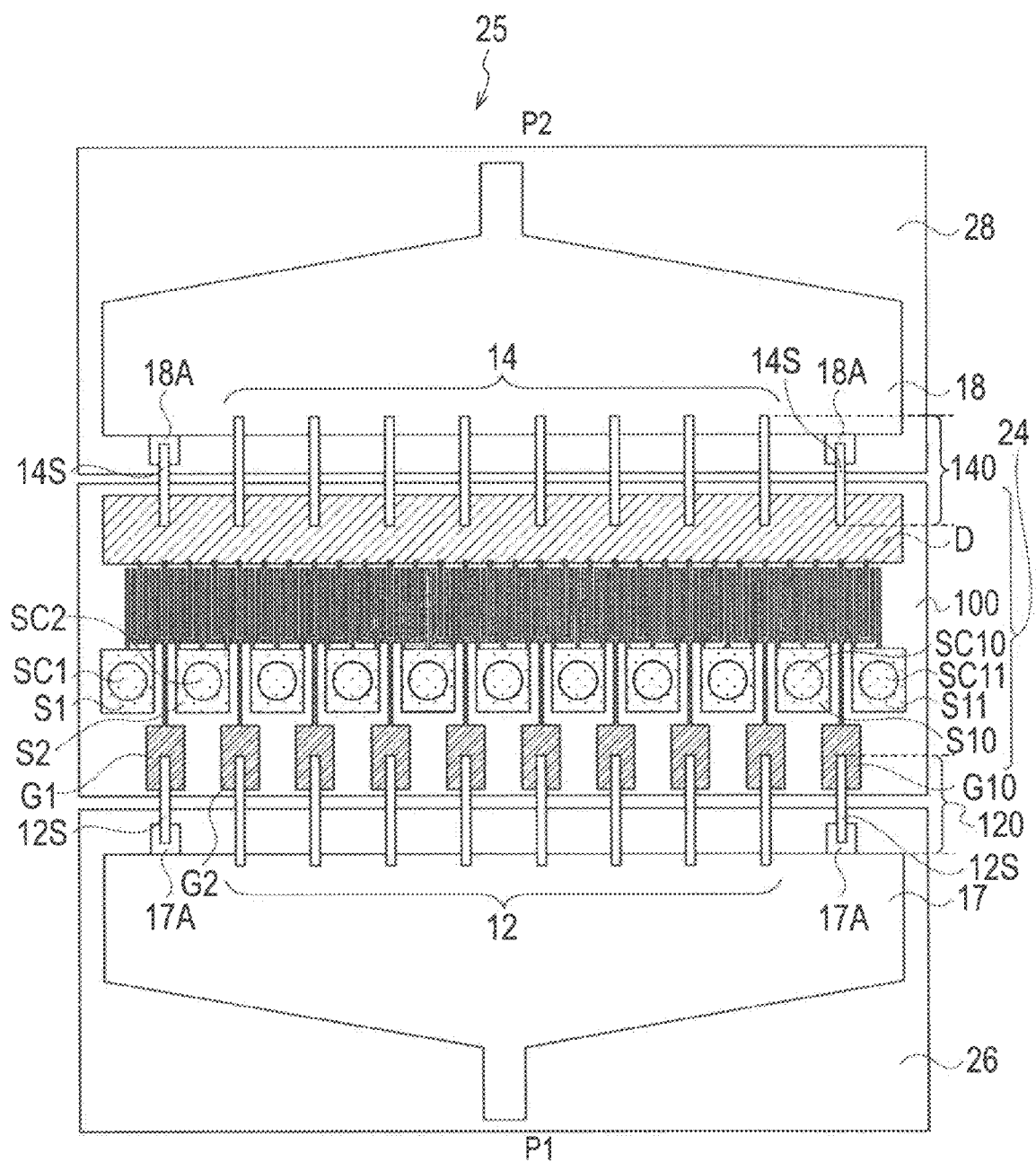
FIG. 14 is a schematic plane pattern configuration diagram of a high frequency semiconductor device according to a fourth embodiment of the present invention.

As for the schematic plane pattern configuration of the high frequency semiconductor device related to a fourth embodiment, as shown in FIG. 14, the input circuit pattern 17 and the output circuit pattern 18 include microstrip lines 17A and 18A for wavelength-shortening in the edge part, respectively. Other configurations are the same as that of the high frequency semiconductor device according to the first embodiment.

That is, in the high frequency semiconductor device according to the fourth embodiment, the input circuit pattern 17 includes a microstrip line 17A for wavelength-shortening in an edge part of the input circuit pattern 17. Similarly, the output circuit pattern 18 includes a microstrip line 18A for wavelength-shortening in an edge part of the output circuit pattern 18.

The inductance component can be increased according to the wavelength-shortening effect of dielectrics by extending the connecting pattern of the input circuit pattern 17 for an input bonding wire 12S connected to edge parts of the input circuit pattern 17, and replacing a part of the inductance component of the input bonding wire 12 by the microstrip line 17A for wavelength-shortening. Similarly, the inductance component can be increased according to the wavelength-shortening effect of dielectrics by extending the connecting pattern of the output circuit pattern 18 for an output bonding wire 14S connected to edge parts of the output circuit pattern 18, and replacing a part of inductance component of the output bonding wire 14 by the microstrip line 18A for wavelength-shortening. Since the microstrip lines 17A and 18A for wavelength-shortening are formed on the dielectric substrate, the wavelength-shortening effect can be increased by increasing the dielectric constant of the dielectric substrate.

In the high frequency semiconductor device according to the fourth embodiment, the length of the input bonding wires 12S of the both ends of the input circuit pattern 17 is shorter than the length of the input bonding wires 12 of the central part of the input circuit pattern 17, and wavelength-shortening of the input signal which spreads the input bonding wires 12S of the both ends of the input circuit pattern 17 is achievable, among a plurality of the input bonding wires 12 and 12S, via the microstrip lines 17A for wavelength-shortening. Similarly, the length of the output bonding wires 14S of the both ends of the output circuit pattern 18 is shorter than the length of the output bonding wires 14 of the central part of the output circuit pattern 18, and wavelength-shortening of the output signal which spreads the output bonding wires 14S of the both ends of the output circuit pattern 18 is achievable, among a plurality of the output bonding wires 14 and 14S, via the microstrip lines 18A for wavelength-shortening.

According to the fourth embodiment, the high frequency semiconductor device, which matches the input/output signal phase by adjusting substantially the inductance distribution of a plurality of the input/output bonding wires, improves the gain and the output power, and suppresses the oscillation by unbalanced operation of each FET cell, can be provided.

[Fifth Embodiment]

Figure 15:
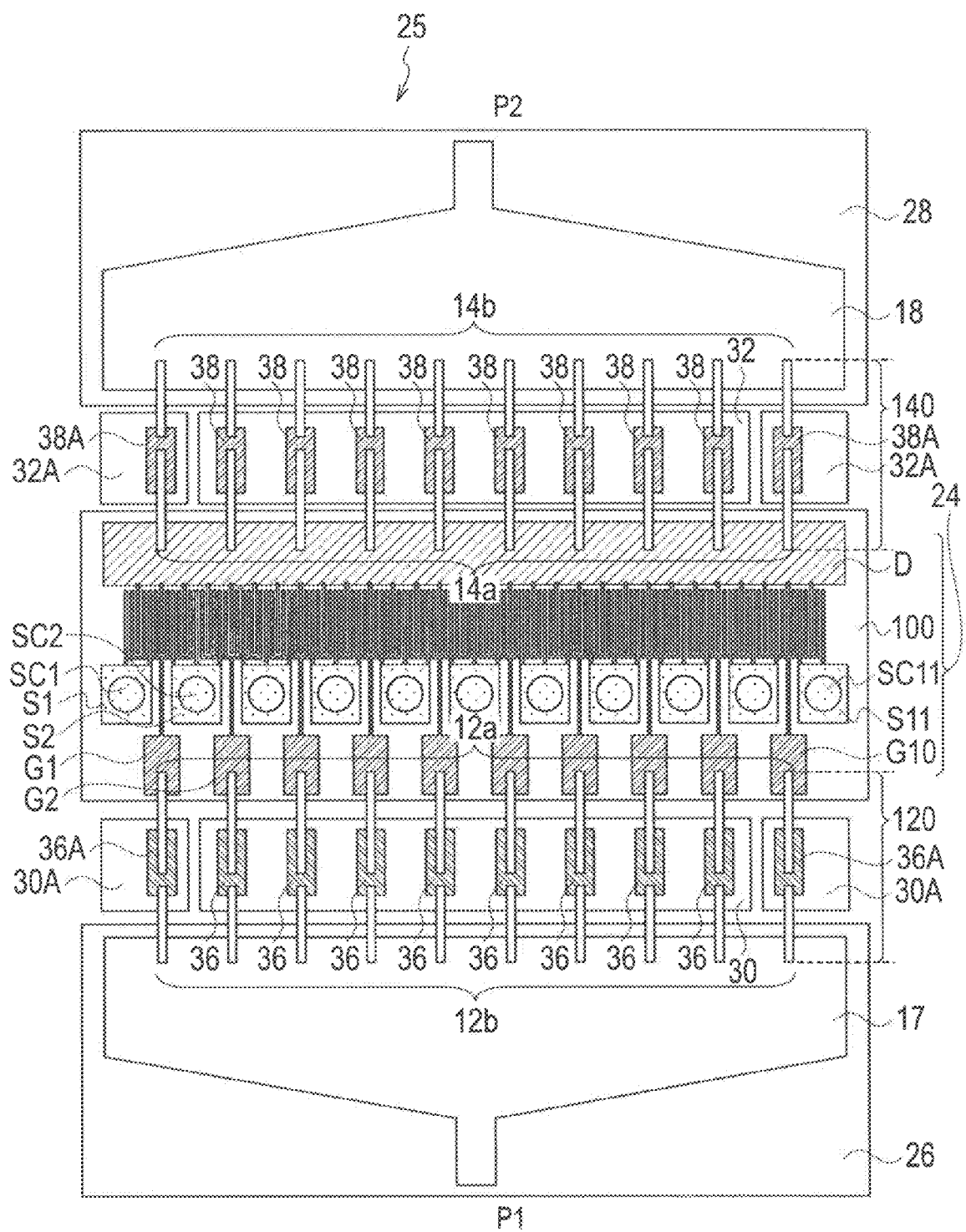
FIG. 15 is a schematic plane pattern configuration diagram of a high frequency semiconductor device according to a fifth embodiment of the present invention.

As shown in FIG. 15, a schematic plane pattern configuration of a high frequency semiconductor device according to a fifth embodiment includes: first input side dielectric substrates 30A and a second input side dielectric substrate 30 which are disposed between the FET 24 and the input circuit pattern 17; and first output side dielectric substrates 32A and a second output side dielectric substrate 32 which are disposed between the FET 24 and the output circuit pattern 18. Other configurations are the same as that of the high frequency semiconductor device according to the first embodiment.

That is, in the high frequency semiconductor device according to the fifth embodiment, the input connecting element 120 includes: two first input side dielectric substrates 30A disposed between the FET 24 and the input circuit pattern 17; a second input side dielectric substrate 30 disposed between the FET 24 and the input circuit pattern 17 and between the two first input side dielectric substrates 30A; a plurality of first input bonding wires configured to connect the plurality of the gate terminal electrodes G1~G10 and the first and second input side dielectric substrates 30A and 30; and a plurality of second input bonding wires configured to connect the first and second input side dielectric substrates 30A and 30 and the input circuit pattern 17, and a dielectric constant of the first input side dielectric substrates 30A is made higher than a dielectric constant of the second input side dielectric substrate 30.

Similarly, in the high frequency semiconductor device according to the fifth embodiment, the output connecting element 140 includes: two first output side dielectric substrates 32A disposed between the FET 24 and the output circuit pattern 18; a second output side dielectric substrate 32 disposed between the FET 24 and the output circuit pattern 18 and between the two first output side dielectric substrates 32A; a plurality of first output bonding wires configured to connect the drain terminal electrode D and the first and second output side dielectric substrates 32A and 32; and a plurality of second output bonding wires configured to connect the first and second output side dielectric substrates 32A and 32 and the output circuit pattern 18, and a dielectric constant of the first output side dielectric substrates 32A is made higher than a dielectric constant of the second output side dielectric substrate 32.

The inductance in the edge parts of the input circuit pattern 17 can be increased according to the difference of the shortening coefficient of wavelength of dielectrics by setting up the dielectric constant of first input side dielectric substrates 30A which form the connecting patterns 36A for the input bonding wires 12a and 12b in the edge parts of the input circuit pattern 17 more highly than the dielectric constant of second input side dielectric substrates 30 which form the connecting patterns 36 for the input bonding wires 12a and 12b in the central part of the input circuit pattern 17.

Similarly, the inductance in the edge parts the output circuit pattern 18 can be increased according to the difference of the shortening coefficient of wavelength of dielectrics by setting up the dielectric constant of first output side dielectric substrates 32A which form the connecting patterns 38A for the output bonding wires 14a and 14b in the edge parts of the output circuit pattern 18 more highly than the dielectric constant of second output side dielectric substrates 32 which form the connecting patterns 38 for the output bonding wires 14a and 14b in the central part of the output circuit pattern 18.

According to the fifth embodiment, the high frequency semiconductor device, which matches the input/output signal phase by adjusting substantially the inductance distribution of a plurality of the input/output bonding wires, improves the gain and the output power, and suppresses the oscillation by unbalanced operation of each FET cell, can be provided.

[Sixth Embodiment]

Figure 16:
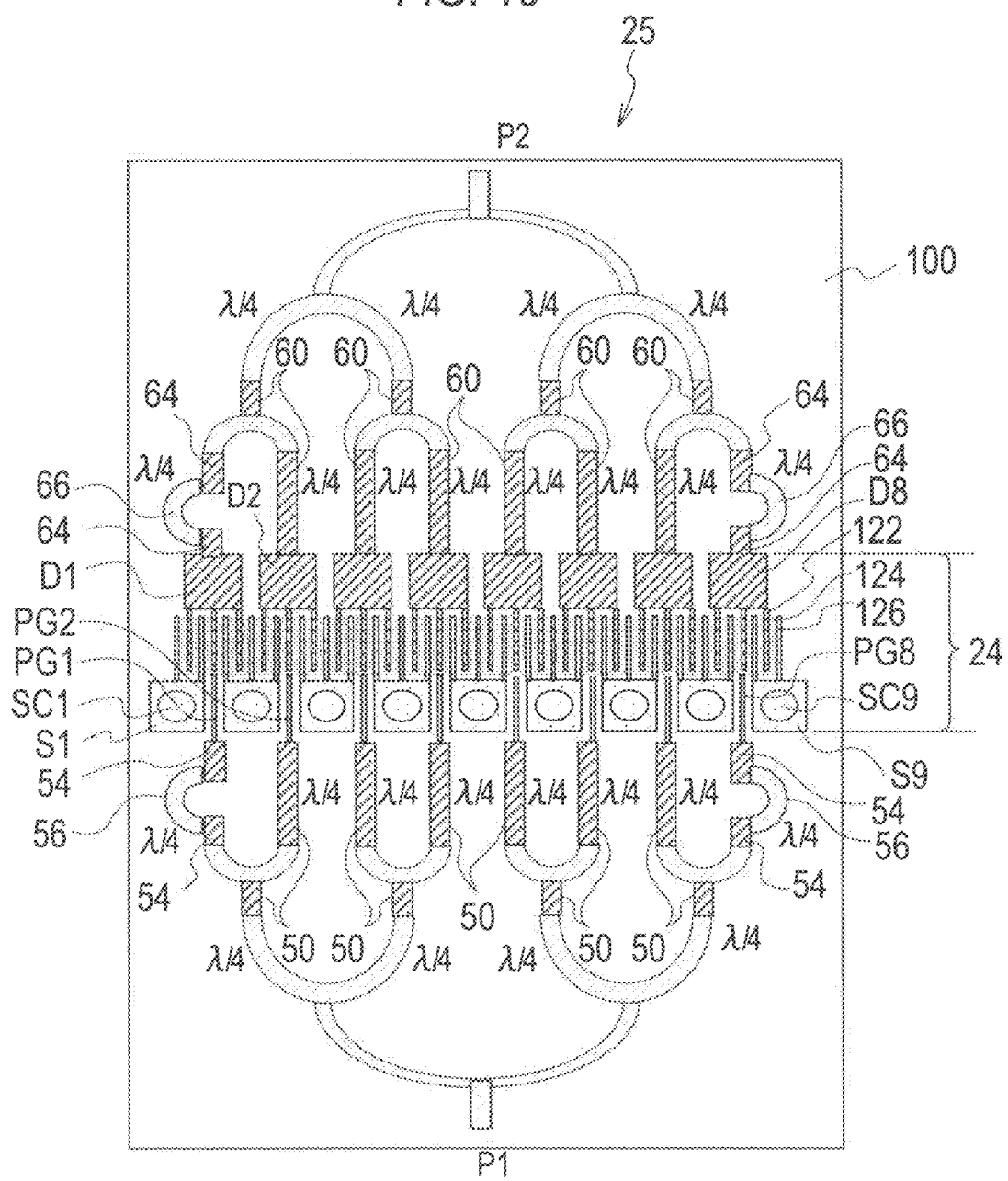
FIG. 16 is a schematic plane pattern configuration diagram of a high frequency semiconductor device according to a comparative example.

As shown in FIG. 16, a schematic plane pattern configuration of a high frequency semiconductor device according to a sixth embodiment includes: an FET 24; a plurality of input transmission lines (50, 54, and 56) which are adjoining the FET 24 and are disposed between the FET 24 and the input terminal P1; and a plurality of output transmission lines (60, 64, and 66) which are adjoining the FET 24 and are disposed between the FET 24 and the output terminal P2.

In the high frequency semiconductor device 25 according to the sixth embodiment, the FET 24 includes: a semi-insulating substrate 100; a gate finger electrode 124, a source finger electrode 126, and a drain finger electrode 122 which are disposed on a first surface of the semi-insulating substrate 100 and each of which has a plurality of fingers; a plurality of gate extraction electrodes PG1 to PG8, a plurality of source terminal electrodes S1~S9, and a plurality of drain terminal electrodes D1~D8 which are disposed on a first surface of the semi-insulating substrate 100, and tie a plurality of fingers, respectively for every the gate finger electrode 124, the source finger electrode 126, and the drain finger electrode 122; VIA holes SC1 to SC9 disposed under the source terminal electrodes S1 to S9; and a ground electrode which is disposed on a second surface of the opposite side of the first surface of the semi-insulating substrate 100, and is connected via the VIA holes SC1 to SC9 to the source terminal electrodes S1 to S9.

A plurality of input transmission lines 50 which are disposed adjoining of the FET 24, and are connected to a plurality of gate extraction electrodes PG2 to PG7, and the input transmission lines 54 and 56 of both terminals are connected to the gate extraction electrodes PG1 and PG8.

A plurality of output transmission lines 60 which are disposed adjoining of the FET 24, and are connected to the drain terminal electrodes D2 to D7, and the output transmission lines 64 and 66 of both terminals are connected to the drain terminal electrodes D1 and D8, respectively.

In the high frequency semiconductor device 25 according to the sixth embodiment, a phase of the transmission signal of a plurality of the input transmission lines 50, 54, and 56 is matched by adjusting an inductance distribution of the plurality of the input transmission lines 50, 54, and 56.

Similarly, in the high frequency semiconductor device 25 according to the sixth embodiment, a phase of a transmission signal of the plurality of the output transmission lines 60, 64, and 66 is matched by adjusting an inductance distribution of a plurality of the output transmission lines 60, 64, and 66.

Figure 17:
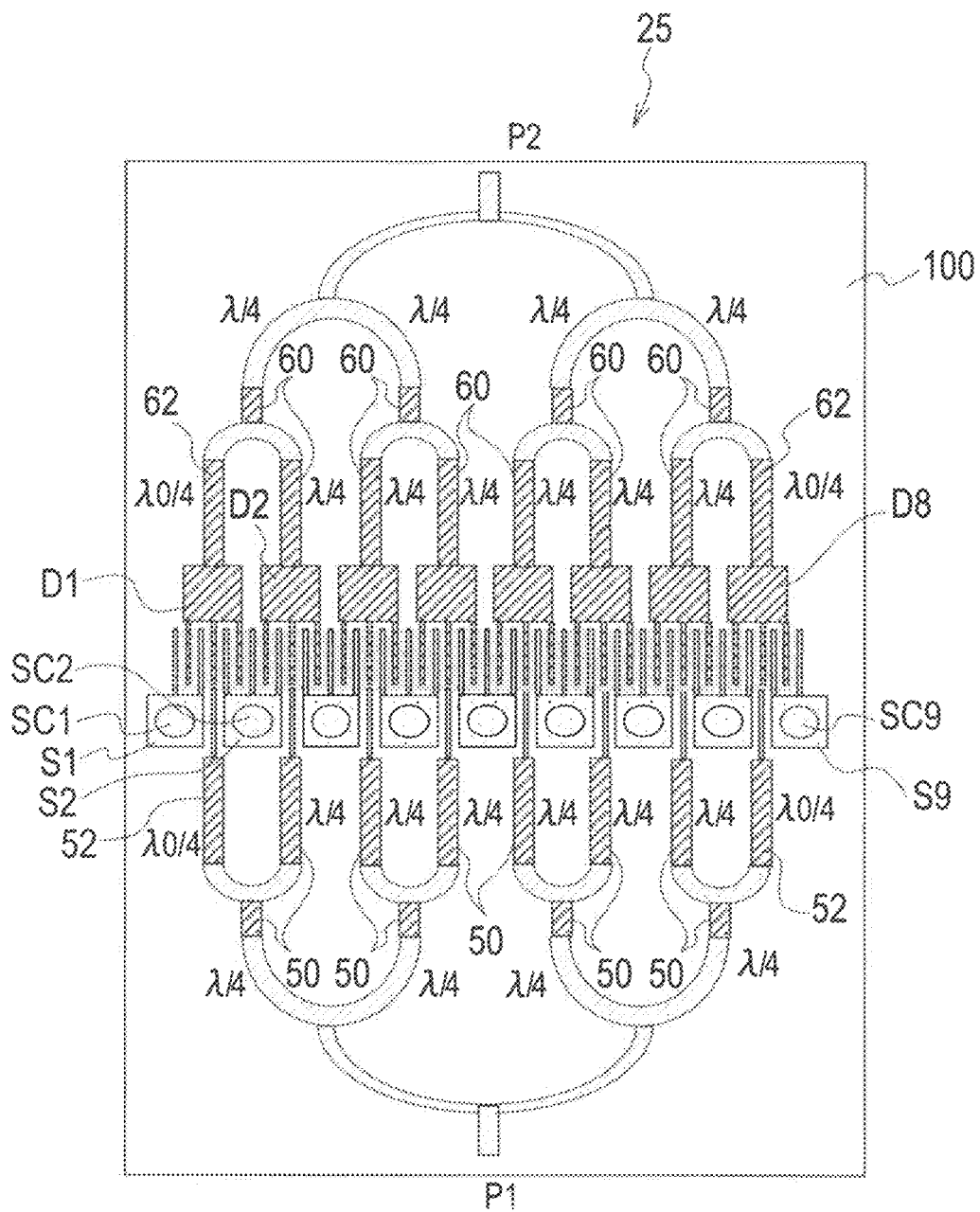
FIG. 17 is a schematic plane pattern configuration diagram of a high frequency semiconductor device according to a sixth embodiment of the present invention.

FIG. 17 shows a schematic plane pattern configuration of a high frequency semiconductor device according to a comparative example. In FIG. 17, the input transmission lines 50 are connected to a plurality of the gate extraction electrodes PG2 to PG7. The input transmission lines 52 of both terminals are connected to the gate extraction electrodes PG1 and PG8. The output transmission lines 60 are connected to the drain terminal electrodes D2 to D7, and the output transmission lines 62 of both ends are connected to the drain terminal electrodes D1 and D8, respectively. The input transmission lines 52 of both terminals compose a quarter wavelength ($\lambda_0/4$) stripline in the example of FIG. 17. It is in the relation of $\lambda_0/4 > \lambda/4$ as compared with the quarter wavelength ($\lambda/4$) stripline which the input transmission lines 50 have. Similarly, the output transmission lines 62 of both terminals compose a quarter wavelength ($\lambda_0/4$) stripline, and it is in the relation of $\lambda_0/4 > \lambda/4$ as compared with the quarter wavelength ($\lambda/4$) stripline which the output transmission lines 60 have. Therefore, in the high frequency semiconductor device according to the comparative example, in the input transmission lines 52 and the output transmission lines 62 on both ends, since the inductance distribution is varied, it is difficult to match the input/output signal phase.

On the other hand, in the high frequency semiconductor device 25 according to the sixth embodiment, the phase of the transmission signal of a plurality of the input transmission lines 50, 54, and 56 is matched by adjusting the inductance distribution of a plurality of the input transmission lines 50, 54, and 56, and the phase of the transmission signal of a plurality of the output transmission lines 60, 64, and 66 is matched by adjusting the inductance distribution of a plurality of the output transmission lines 60, 64, and 66.

In the high frequency semiconductor device 25 according to the sixth embodiment, an inductance of the input transmission lines 56 connected to edge parts of the plurality of gate extraction electrodes PG1~PG8 is uniformed with an inductance of the input transmission lines 50 connected to a part other than the edge parts. Similarly, an inductance of the output transmission lines connected to edge parts of the plurality of the drain electrodes D1~D8 is uniformed with an inductance 60 of the output transmission lines connected to a part other than the edge parts.

The length of the input transmission line 56 of the edge part may be longer than the length of the input transmission line 50 of the central part among a plurality of the input transmission lines 50, 54, and 56, and the length of the output transmission line 66 of the edge part may be longer than the length of the output transmission line 60 of the central part among a plurality of the output transmission lines 60, 64, and 66.

In the high frequency semiconductor device 25 according to the sixth embodiment, the length of only one of the input transmission lines 54 and 56 on both ends may be longer than the length of the input transmission line 50 of the central part among a plurality of the input transmission lines 50, 54, and 56, and the length of only one of the output transmission lines 64 and 66 on both ends may be longer than the length of the output transmission line 60 of the central part among a plurality of the output transmission lines 60, 64, and 66.

That is, in the high frequency semiconductor device according to the sixth embodiment, the input transmission lines 54 and 56 connected to edge parts of the plurality of gate extraction electrodes PG1~PG8 may be longer than the input transmission lines 50 connected to the part other than the edge parts. Similarly, the output transmission lines 64 and 66 connected to edge parts of the drain terminal electrodes D1~D8 may be longer than the output transmission lines 60 connected to the part other than the edge parts.

Furthermore, in the high frequency semiconductor device according to the sixth embodiment, one input transmission line at each edge of the plurality of gate extraction electrodes PG1~PG8 may be longer than the other input transmission lines 50. Similarly, one output transmission line at each edge of the drain terminal electrode D1~D8 is longer than the other output transmission lines 60.

In the high frequency semiconductor device 25 according to the sixth embodiment, the length of only one of the input transmission lines 54 and 56 on both ends may be ten percent (10%) longer than the length of the input transmission line 50 of the central part among a plurality of the input transmission lines 50, 54, and 56, and the length of only one of the output transmission lines 64 and 66 on both ends may be ten percent (10%) longer than the length of the output transmission line 60 of the central part among a plurality of the output transmission lines 60, 64, and 66.

That is, in the high frequency semiconductor device according to the sixth embodiment, the one input transmission line at each edge of the plurality of gate extraction electrodes PG1~PG8 may be ten percent (10%) longer than the other input transmission lines. Similarly, the one output transmission line at each edge of the drain terminal electrodes D1~D8 may be ten percent (10%) longer than the other output transmission lines.

A plurality of the input transmission lines 50, 54, and 56 and a plurality of the output transmission lines 60, 64, and 66 compose the Wilkinson coupled circuit for the FET 24.

That is, in the high frequency semiconductor device according to the sixth embodiment, a plurality of the input transmission lines may provide a Wilkinson coupled circuit for the FET 24. Similarly, a plurality of the output transmission lines may provide a Wilkinson coupled circuit for the FET 24.

As shown in FIG. 16, it can input into parallel by phase matching the input signal power, performing the impedance conversion to 50Ω for the FET cell by which parallel connection is performed, by composing the input transmission lines 50, 54, and 56 connected between the input terminals P1 and the gate extraction electrodes PG1 to PG8 of the FET 24 by the Wilkinson coupled circuit composed of quarter wavelength ($\lambda/4$) striplines. Similarly, it can output to parallel by phase matching the output signal power, performing the impedance conversion to 50Ω from the FET cell by which parallel connection is performed, by composing the output transmission lines 60, 64, and 66 connected between the output terminal P2 and the drain terminal electrodes D1 to D8 by the Wilkinson coupled circuit composed of quarter wavelength (λ/4) striplines.

Moreover, a plurality of the input transmission lines 50, 54, and 56 and a plurality of the output transmission lines 60, 64, and 66 are provided on the same semi-insulating substrate as a semi-insulating substrate 100 in which the FET 24 is formed, and compose MMIC (Monolithic Microwave Integrated Circuit).

That is, in the high frequency semiconductor device according to the sixth embodiment, a plurality of the input transmission lines may be provided on a same semi-insulating substrate as the semi-insulating substrate of the FET 24. Similarly, a plurality of the output transmission lines may be provided on a same semi-insulating substrate as the semi-insulating substrate of the FET 24.

Moreover, in the high frequency semiconductor device 25 according to the sixth embodiment, the drain terminal electrodes D1 to D8 are divided.

Moreover, in the FET 24 applied to the high frequency semiconductor device according to the sixth embodiment, the semi-insulating substrate 100 can compose a GaAs substrates, a SiC substrates, a GaN substrates, a substrate in which a GaN epitaxial layer is formed on a SiC substrate, a substrate in which the heterojunction epitaxial layer composed of GaN/AlGaN is formed on a SiC substrate, a sapphire substrate, or a diamond substrate, for example.

(Modified Example)

As shown in FIG. 18, as for the high frequency semiconductor device 25 according to a modified example of the sixth embodiment, the drain terminal electrode D is connected in common. Other configurations are the same as that of the sixth embodiment.

According to the sixth embodiment and its modified example, the high frequency semiconductor device, which matches the input/output signal phase by adjusting substantially the inductance distribution of a plurality of the input/output transmission lines, improves the gain and the output power, and suppresses the oscillation by unbalanced operation of each FET cell, can be provided.

[Other Embodiments]

While the present invention is described in accordance with the aforementioned first through sixth embodiments and modified example of those embodiments, it should not be understood that the description and drawings that configure part of this disclosure are to limit the present invention. This disclosure makes clear a variety of alternative embodiments, working examples, and operational techniques for those skilled in the art.

For example, in the high frequency semiconductor device according to the second through sixth embodiments, the input circuit pattern 17 and the output circuit pattern 18 may be composed of a microwave transmission line provided on the dielectric substrate 26 and 28, respectively, which is disposed adjoining the field effect transistor.

Moreover, in the FET 24 applied to the high frequency semiconductor device according to the second through the sixth embodiments, the semi-insulating substrate 100 can be composed by any one of a GaAs substrate, a SiC substrate, a GaN substrate, the substrate in which a GaN epitaxial layer is formed on a SiC substrate, the substrate in which the heterojunction epitaxial layer composed of GaN/AlGaN is formed on a SiC substrate, a sapphire substrate, or a diamond substrate, for example.

For example, in the high frequency semiconductor device according to the second through sixth embodiments, the input circuit pattern 17 provided on the dielectric substrate 26 and the output circuit pattern 18 provided on the dielectric substrate 28 may be composed of a Wilkinson coupled circuit for the field effect transistor.

For example, in the high frequency semiconductor device according to the second through sixth embodiments, the drain terminal electrode may be divided.

In addition, it cannot be overemphasized that the high frequency semiconductor devices according to the embodiments of the present invention are applicable not only to FETs (Field Effect Transistors) but also other amplifying elements, such as LDMOS (Laterally Diffused Metal-Oxide-Semiconductor) FETS, HEMTs (High Electron Mobility Transistors), HBTs (Hetero-junction Bipolar Transistors), and MEMS (Micro Electro Mechanical Systems) devices.

Such being the case, the present invention covers a variety of embodiments, whether described or not.

Industrial Applicability

A high frequency semiconductor device according to the present invention has a wide range of application fields, such as an internally matched power amplifier, a power MMIC (Monolithic Microwave Integrated Circuit), a microwave power amplifier, a millimeter wave power amplifier, and a high frequency MEMS device.

Reference Signs List

10: Ceramic cap;
12, 12L, 12M, 12T, 12W, 12S, 12a, 12b: Input bonding wire;
14, 14L, 14M, 14T, 14W, 14S, 14a, 14b: Output bonding wire;
16: Ceramic wall;
17: Input circuit pattern;
18: Output circuit pattern;
17A, 18A: Microstrip line for wavelength-shortening;
19a: Input stripline;
19b: Output stripline;
20: Insulating layer;
24: FET (Field Effect Transistor);
25: High frequency semiconductor device;
26, 28: Dielectric substrate;
30A: First input side dielectric substrate;
30: Second input side dielectric substrate;
32A: First output side dielectric substrate;
32: Second output side dielectric substrate;
36, 36A, 38, 38A: Connecting pattern;
40, 50, 60: Quarter wavelength (λ/4) stripline;
52, 54, 56, 62, 64, 66: Transmission line;
100: Semi-insulating substrate;
120: Input connecting element;
122: Drain finger electrode;
124: Gate finger electrode;
125: Ground conductor;
126: Source finger electrode;
140: Output connecting element;
P1: Input terminal;
P2: Output terminal;
G1, G2 , . . . , G10: Gate terminal electrode;
S1, S2 , . . . , S11: Source terminal electrode;
D, D1, D2 , . . . , D10: Drain terminal electrode;
SC1 to SC11: VIA hole;
BWI1, BWI2 , . . . , BWI5: Input bonding wire;
BWO1, BWO2 , . . . , BWO5: Output bonding wire; and
L1 to L11: Inductance.

The invention claimed is:

1. A high frequency semiconductor device comprising: a field effect transistor including a semi-insulating substrate, gate finger electrode, a source finger electrode, and a drain finger electrode which are disposed on a first surface of the semi-insulating substrate and each of which has a plurality of fingers, a plurality of gate terminal electrodes, a plurality of source terminal electrodes, and a drain terminal electrode which are disposed on the first surface of the semi-insulating substrate, said plurality of gate terminal electrodes tied to respective plural fingers of said gate finger electrode, said plurality of source terminal electrodes tied to respective plural fingers of said source finger electrode, and said drain terminal electrode tied to plural fingers of said drain finger electrode, a VIA hole disposed under the source terminal electrode, and a ground electrode which is disposed on a second surface of the opposite side of the first surface of the semi-insulating substrate, and is connected via the VIA hole to the source terminal electrode; an input circuit pattern and an output circuit pattern which are disposed adjoining of the field effect transistor; an input connecting element configured to connect the plurality of the gate terminal electrodes and the input circuit pattern; and an output connecting element configured to connect the drain terminal electrode and the output circuit pattern, wherein a phase of a transmission signal of the input connecting element is matched by adjusting an inductance distribution of the input connecting element.

2. The high frequency semiconductor device according to claim 1, wherein
the input connecting element comprises:
two first input side dielectric substrates disposed between the field effect transistor and the input circuit pattern;
a second input side dielectric substrate disposed between the field effect transistor and the input circuit pattern and between the two first input side dielectric substrates;
a plurality of first input bonding wires configured to connect the plurality of the gate terminal electrodes and the first and second input side dielectric substrates; and
a plurality of second input bonding wires configured to connect the first and second input side dielectric substrates and the input circuit pattern, and a dielectric constant of the first input side dielectric substrates being made higher than a dielectric constant of the second input side dielectric substrate.

3. The high frequency semiconductor device according to claim 1, wherein
the input circuit pattern includes a microwave transmission line provided on a dielectric substrate disposed adjoining the field effect transistor.

4. The high frequency semiconductor device according to claim 1, wherein
the input connecting element comprises a plurality of input bonding wires.

5. The high frequency semiconductor device according to claim 4, wherein
the input circuit pattern includes a microstrip line for wavelength-shortening in an edge part of the input circuit pattern.

6. The high frequency semiconductor device according to claim 4, wherein
the input circuit pattern provides a Wilkinson coupled circuit for the field effect transistor.

7. The high frequency semiconductor device according to claim 4, wherein
an inductance of the input bonding wires connected to edge parts of the input circuit pattern is uniformed with an inductance of the input bonding wires connected to a part other than the edge parts of the input circuit pattern.

8. The high frequency semiconductor device according to claim 7, wherein
the input bonding wires connected to the edge parts are longer than the input bonding wires connected to the part other than the edge parts.

9. The high frequency semiconductor device according to claim 8, wherein
one input bonding wire at each edge of the plurality of the input bonding wires is longer than other input bonding wires.

10. The high frequency semiconductor device according to claim 9, wherein
the one input bonding wire at each edge of the plurality of the input bonding wires is ten percent (10%) longer than the other input bonding wires.

11. The high frequency semiconductor device according to claim 4, wherein
a diameter of the input bonding wires connected to edge parts of the input circuit pattern is shorter than a diameter of the input bonding wires connected to a part other than the edge parts, and the plurality of the input bonding wires are ten percent (10%) longer than a case that the plurality of the input bonding wires have a same diameter.

12. The high frequency semiconductor device according to claim 11, wherein
a diameter of one input bonding wire at each edge of the plurality of the input bonding wires is shorter than a diameter of other input bonding wires.

13. The high frequency semiconductor device according to claim 4, wherein
input bonding wires other than one input bonding wire at each edge of the plurality of the input bonding wires are provided by a set of two input bonding wires.

14. The high frequency semiconductor device according to claim 13, wherein
in each set of the two input bonding wires, the two input bonding wires are connected to one of the gate terminal electrodes in a closed manner and to the input circuit pattern in an open manner, an interval in the open manner being narrower towards edge parts of the plurality of the input bonding wires.

15. A high frequency semiconductor device comprising: a field effect transistor including a semi-insulating substrate, gate finger electrode, a source finger electrode, and a drain finger electrode which are disposed on a first surface of the semi-insulating substrate and each of which has a plurality of fingers, a plurality of gate terminal electrodes, a plurality of source terminal electrodes, and a drain terminal electrode which are disposed on the first surface of the semi-insulating substrate, said plurality of gate terminal electrodes tied to respective plural fingers of said gate finger electrode, said plurality of source terminal electrodes tied to respective plural fingers of said source finger electrode, and said drain terminal electrode tied to plural fingers of said drain finger electrode, a VIA hole disposed under the source terminal electrode, and a ground electrode which is disposed on a second surface of the opposite side of the first surface of the semi-insulating substrate, and is connected via the VIA hole to the source terminal electrode; an input circuit pattern and an output circuit pattern which are disposed adjoining of the field effect transistor; an input connecting element configured to connect the plurality of the gate terminal electrodes and the input circuit pattern; and an output connecting element configured to connect the drain terminal electrode and the output circuit pattern, wherein a phase of a transmission signal of the output connecting element is matched by adjusting an inductance distribution of the output connecting element.

16. The high frequency semiconductor device according to claim 15, wherein
the output connecting element comprises:
two first output side dielectric substrates disposed between the field effect transistor and the output circuit pattern;
a second output side dielectric substrate disposed between the field effect transistor and the output circuit pattern and between the two first output side dielectric substrates;
a plurality of first output bonding wires configured to connect the drain terminal electrode and the first and second output side dielectric substrates; and
a plurality of second output bonding wires configured to connect the first and second output side dielectric substrates and the output circuit pattern, and a dielectric constant of the first output side dielectric substrates being made higher than a dielectric constant of the second output side dielectric substrate.

17. The high frequency semiconductor device according to claim 15, wherein
the output circuit pattern includes a microwave transmission line provided on a dielectric substrate disposed adjoining the field effect transistor.

18. The high frequency semiconductor device according to claim 15, wherein
the output connecting element comprises a plurality of output bonding wires.

19. The high frequency semiconductor device according to claim 18, wherein
the output circuit pattern includes a microstrip line for wavelength-shortening in an edge part of the output circuit pattern.

20. The high frequency semiconductor device according to claim 18, wherein
the output circuit pattern provides a Wilkinson coupled circuit for the field effect transistor.

21. The high frequency semiconductor device according to claim 18, wherein
an inductance of the output bonding wires connected to edge parts of the output circuit pattern is uniformed with an inductance of the output bonding wires connected to a part other than the edge parts of the output circuit pattern.

22. The high frequency semiconductor device according to claim 21, wherein
the output bonding wires connected to the edge parts are longer than the output bonding wires connected to the part other than the edge parts.

23. The high frequency semiconductor device according to claim 22, wherein
one output bonding wire at each edge of the plurality of the output bonding wires is longer than other output bonding wires.

24. The high frequency semiconductor device according to claim 23, wherein
the one output bonding wire at each edge of the plurality of the output bonding wires is ten percent (10%) longer than the other output bonding wires.

25. The high frequency semiconductor device according to claim 18, wherein
a diameter of the output bonding wires connected to edge parts of the output circuit pattern is shorter than a diameter of the output bonding wires connected to a part other than the edge parts, and the plurality of the output bonding wires are ten percent (10%) longer than a case that the plurality of the output bonding wires have a same diameter.

26. The high frequency semiconductor device according to claim 25, wherein
a diameter of one output bonding wire at each edge of the plurality of the output bonding wires is shorter than a diameter of other output bonding wires.

27. The high frequency semiconductor device according to claim 18, wherein
output bonding wires other than one output bonding wire at each edge of the plurality of the output bonding wires are provided by a set of two output bonding wires.

28. The high frequency semiconductor device according to claim 27, wherein,
in each set of the two output bonding wires, the two output bonding wires are connected to the drain terminal electrode in a closed manner and to the output circuit pattern in an open manner, an interval in the open manner being narrower towards edge parts of the plurality of the output bonding wires.

* * * * *